(12) United States Patent
Chow et al.

(10) Patent No.: US 7,889,544 B2
(45) Date of Patent: Feb. 15, 2011

(54) HIGH-SPEED CONTROLLER FOR PHASE-CHANGE MEMORY PERIPHERAL DEVICE

(75) Inventors: David Q. Chow, San Jose, CA (US);
Charles C. Lee, Cupertino, CA (US);
Frank I-Kang Yu, Palo Alto, CA (US)

(73) Assignee: Super Talent Electronics, Inc., San Jose, CA (US)

(*) Notice: Subject to any disclaimer, the term of this patent is extended or adjusted under 35 U.S.C. 154(b) by 901 days.

(21) Appl. No.: 11/770,642

(22) Filed: Jun. 28, 2007

(65) Prior Publication Data
US 2007/0255891 A1    Nov. 1, 2007

Related U.S. Application Data

(63) Continuation-in-part of application No. 11/748,595, filed on May 15, 2007, now Pat. No. 7,471,556, and a continuation-in-part of application No. 10/818,653, filed on Apr. 5, 2004, now Pat. No. 7,243,185, and a continuation-in-part of application No. 11/754,332, filed on May 28, 2007.

(51) Int. Cl.
*G11C 11/00* (2006.01)

(52) U.S. Cl. ............ 365/163; 365/230.03; 365/189.011; 365/148

(58) Field of Classification Search ................. 365/163, 365/230.03, 189.01, 148
See application file for complete search history.

(56) References Cited

U.S. PATENT DOCUMENTS 5,933,365 A    8/1999   Klersy et al.
6,512,241 B1   1/2003   Lai
6,869,883 B2   3/2005   Chiang et al.
7,026,639 B2   4/2006   Cho et al.
7,078,273 B2   7/2006   Matsuoka et al.
7,103,718 B2   9/2006   Nickel et al.
2003/0223285 A1  12/2003  Khouri et al.
2004/0094778 A1*  5/2004  Ooishi .................. 257/202
2004/0228163 A1  11/2004  Khouri et al.
2004/0248339 A1  12/2004  Lung
2004/0256610 A1  12/2004  Lung
2005/0185572 A1   8/2005  Resta et al.
2006/0018183 A1   1/2006  De Sandre et al.
2006/0097239 A1   5/2006  Hsiung
2006/0126381 A1   6/2006  Khouri et al.
2006/0203542 A1   9/2006  Kurotsuchi et al.
2006/0274574 A1  12/2006  Choi et al.

* cited by examiner

*Primary Examiner*—Hoai V Ho
*Assistant Examiner*—Jason Lappas
(74) *Attorney, Agent, or Firm*—Stuart T. Auvinen; gPatent LLC

(57) ABSTRACT

Peripheral devices store data in non-volatile phase-change memory (PCM). PCM cells have alloy resistors with high-resistance amorphous states and low-resistance crystalline states. The peripheral device can be a Multi-Media Card/Secure Digital (MMC/SD) card. A PCM controller accesses PCM memory devices. Various routines that execute on a CPU in the PCM controller are activated in response to commands in the host-bus transactions. The PCM system increases the throughput of one or more phase-change memory devices by performing one or more of a read-ahead memory operation, a write-ahead memory write operation, a larger page memory write operation, a wider data bus memory write operation, a multi-channel concurrent multi-bank interleaving memory read or write operation, a write-cache memory write operation, and any combination thereof.

20 Claims, 16 Drawing Sheets

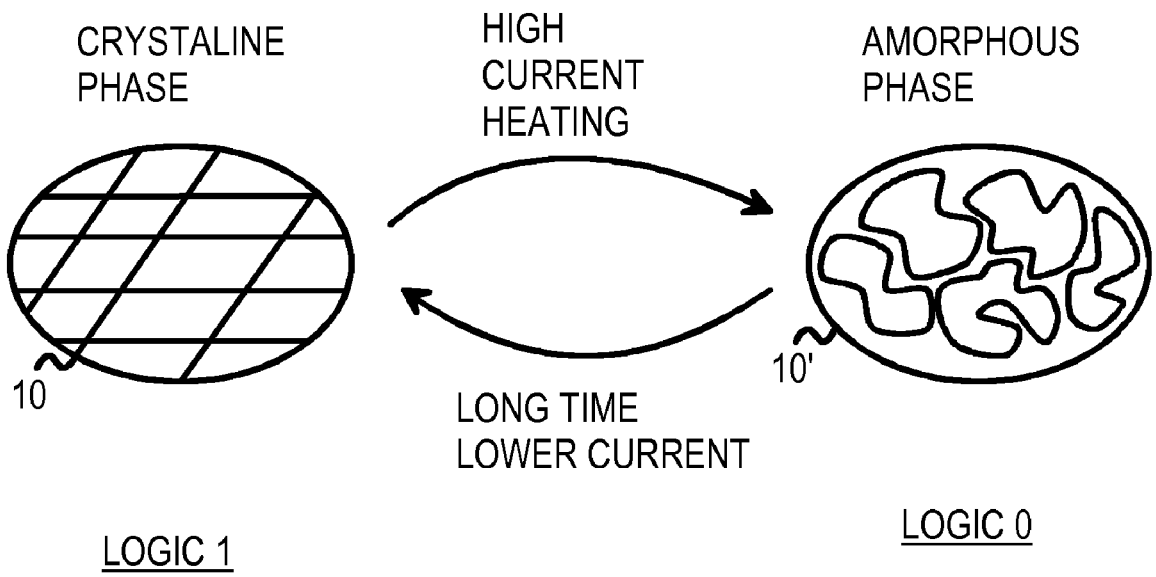
FIG. 1

HIGH-SPEED CONTROLLER FOR PHASE-CHANGE MEMORY PERIPHERAL DEVICE

RELATED APPLICATION

This application is a continuation-in-part of the co-pending application for "Flash-Memory System with a High-Speed Memory Controller", U.S. Ser. No. 10/818,653, filed Apr. 5, 2004, and "Peripherals Using Phase-Change Memories", U.S. Ser. No. 11/754,332, filed May 28, 2007, and "Local Bank Write Buffers for Accelerating a Phase-Change Memory", U.S. Ser. No. 11/748,595 filed May 15, 2007.

FIELD OF THE INVENTION

This invention relates to phase-change memories, and more particularly to high-speed controllers for phase-change memories.

BACKGROUND OF THE INVENTION

Computer code, instructions, user data and other kinds of data have been stored in main memories and peripheral memories that employ a wide variety of technologies. Main memories often use dynamic-random-access memory (DRAM), while faster cache memories and on-chip memories may use static random-access memory (SRAM). Read-only-memory (ROM) may use fuses or masked metal options, or may use electrically-erasable programmable read-only memory (EEPROM) cells. These are randomly-accessible memories since individual words can be read or written without disturbing nearby data. Often individual bytes may be written.

Mass storage memory is block-addressable, where a block of 512 or more bytes must be read or written together as a block. Individual words of 64 bytes or less cannot be separately written without re-writing the whole 512-byte block. Mass storage devices include rotating magnetic disks, optical disks, and EEPROM arranged as flash memory.

Traditionally, flash memory has been used for non-volatile storage. Another kind of non-volatile memory, phase-change memory, was discovered in the 1960's, and was even written about in a paper in Electronics magazine in September 1970 by the founder of Intel Corp., Gordon Moore. However, despite the long-felt need, this 40-year-old technology has not yet been widely used in personal computers and other systems.

Phase-change memory (PCM) uses a layer of chalcogenide glass that can be switched between a crystalline and an amorphous state. The chalcogenide glass layer can be an alloy of germanium (Ge), antimony (Sb), and tellurium (Te). This alloy has a high melting point, which produces the amorphous state when cooled from the melting point. However, when the solid alloy is heated from the amorphous state, the alloy transforms into a crystalline state at a crystallization temperature than is below its melting point. Such heating can be provided by an electric current through the alloy. The state change may occur rapidly, such as in as little as 5 nanoseconds.

One problem with phase-change memory is that write times are data-sensitive. Writing a 1 into a PCM cell may require 100 ns, while writing a 0 to a PCM cell may require only 5 or 10 ns. The cell read time may be relatively short, such as 2-10 ns. Thus writing a 1 to a cell may require 10 times longer than writing a 0 to the cell.

What is desired is a phase-change memory that compensates for asymmetric write times. A phase-change memory that is designed for data-sensitive write delays is desired. A high performance, high write-throughput phase-change memory is desirable, both at the chip level and at a sub-system level of multiple PCM chips. A PCM controller with improved performance for reads and writes is further desired.

BRIEF DESCRIPTION OF THE DRAWINGS

FIG. 1 shows a phase-change memory cell.

DETAILED DESCRIPTION

Figure 2:
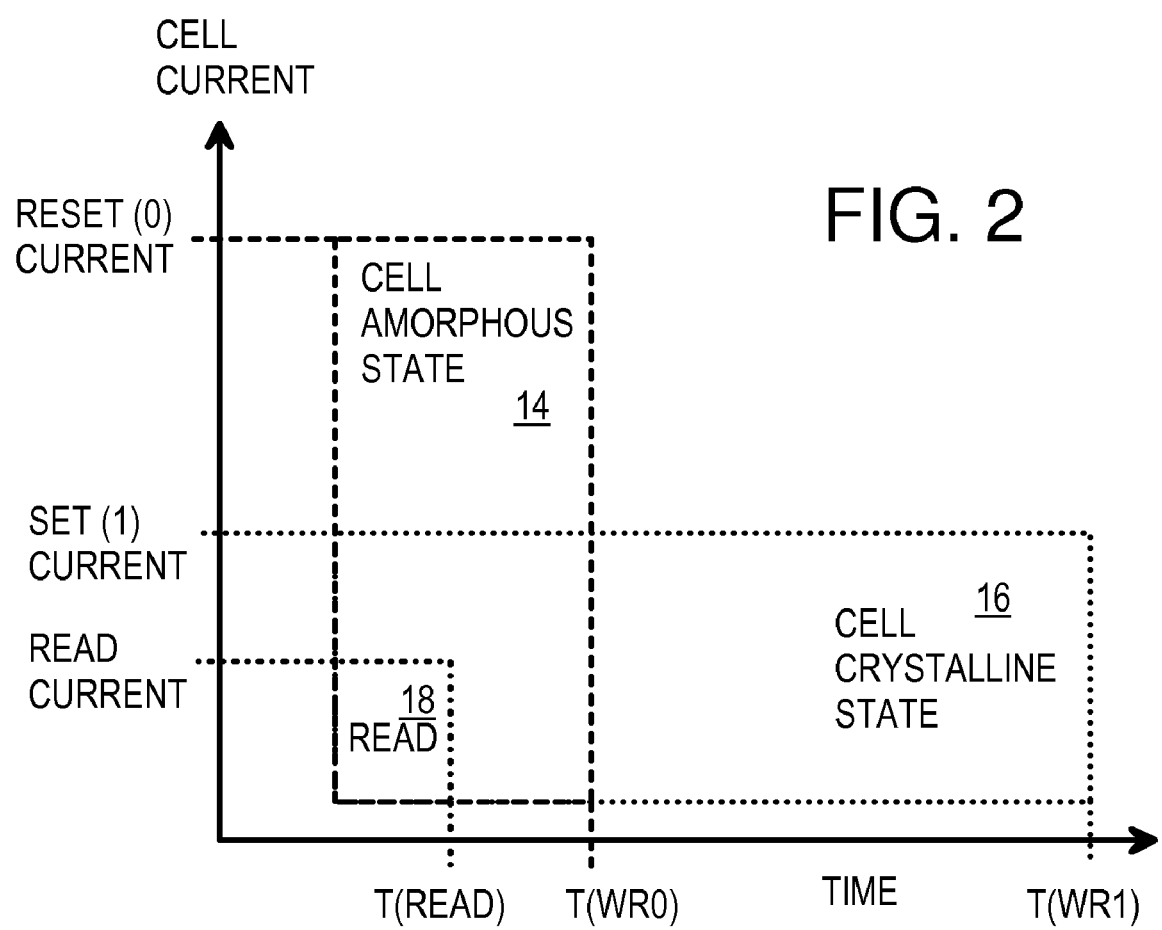
FIG. 2 is a graph of current and time to transform states in a phase-change memory cell.

The present invention relates to an improvement in Phase-Change Memory. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Phase-Change Memory—FIGS. 1-4

FIG. 1 shows a phase-change memory cell. Phase-change memory (PCM) uses a layer of chalcogenide glass that can be switched between a crystalline and an amorphous state. The chalcogenide glass layer can be an alloy of germanium (Ge), antimony (Sb), and tellurium (Te). This alloy has a high melting point, which produces the amorphous state when cooled from the melting point. However, when the solid alloy is heated from the amorphous state, the alloy transforms into a crystalline state at a crystallization temperature than is below its melting point. Such heating can be provided by an electric current through the alloy. The state change may occur rapidly, such as in as little as 5 nanoseconds.

In FIG. 1, when alloy resistor 10 is in the crystalline state, its resistivity is low. The crystalline state represents a logic high or 1. A PCM memory cell has alloy resistor 10 in series with select transistor 12 between a bit line BL and a voltage V. When V is a low voltage such as ground, and word line WL is driven high, the bit-line voltage is pulled from a high pre-charged state to ground through select transistor 12 and alloy resistor 10 due to the low resistance of alloy resistor 10.

When alloy resistor 10' is in the amorphous state, its resistivity is high. The amorphous state represents a logic low or 0. Another PCM memory cell has alloy resistor 10' in series with select transistor 12' between a bit line BL and a voltage V. When V is a low voltage such as ground, and word line WL is driven high, the bit-line voltage remains in its high or pre-charged state, since the high resistance of alloy resistor 10' limits current through select transistor 12'.

Note that the assignment of logical 0 and logic 1 states to the crystalline and amorphous states is arbitrary. The crystalline state could be assigned logical 1 or logical 0, with the amorphous state having the opposite logical value.

Alloy resistor 10 may be a small layer that is integrated with select transistor 12, such as a layer over or near the source terminal of transistor 12. Alternately, alloy resistor 10 may be a separate resistor device, such as a patterned line or snaking line between the source of select transistor 12 and ground.

When a high current is passed through alloy resistor 10, the alloy can transform from the crystalline state into the amorphous state. The high current creates resistive heating in alloy resistor 10 and the melting temperature is rapidly reached, causing the crystal to melt into a liquid. Upon rapid cooling, alloy resistor 10 solidifies into the amorphous state since there is little time for crystals to grow during cooling.

When a lower current is passed through alloy resistor 10 for a long period of time, the crystalline temperature is reached or exceeded. However, the current is not sufficient to cause the higher melting temperature to be reached. The amorphous alloy begins to crystallize over this long time period. For example, small crystal domains within the amorphous state may grow and absorb other domains until alloy resistor 10 contains one or just a few crystal domains.

Thus alloy resistor 10' transforms from the high-resistance amorphous state into the low-resistance crystalline state by applying a moderate current for a relatively long period of time, allowing the crystal to grow at the crystalline temperature. Alloy resistor 10 transforms from the low-resistance crystalline state into the high-resistance amorphous state by applying a high current for a relatively short period of time, allowing the crystal to melt into an amorphous blob at the melting temperature.

FIG. 2 is a graph of current and time to transform states in a phase-change memory cell. Amorphous state 14 is reached when a high current (the reset current) is applied for a time of T(WR0). Crystalline state 16 is reached when a moderate current, the set current, is applied for a longer period of time T(WR1). These states are retained when currents below the moderate current are applied, or when currents are applied for short periods of time. State transformations, or partial state transformations, may occur when the full currents and times are not both met, such as applying the set current for less than the set time. These partial state transformations are undesirable.

The PCM cell can safely be read by applying a lower read current for a short period of time. For example, the read current can be less than either the set or reset currents. Reading 18 has the read current applied for less than the set or reset times, T(WR1), T(WR0), respectively. For example, the read time T(READ) can be less than half of the reset time, and the read current can be less than half of the set current. The reset current can be double or more the set current, and the set time can be double, triple, 5×, or more of the reset time.

Since the set time T(WR1) is so much longer than the reset time T(WR0), the time to write a memory cell is dependent on the data itself. Since data often contains both 1's and 0's, both setting and resetting can occur for the same data word. The reset time can overlap with the longer reset time, allowing both set and reset to overlap in time. Then the overall write time is determined by the longer set period of time.

Figure 3:
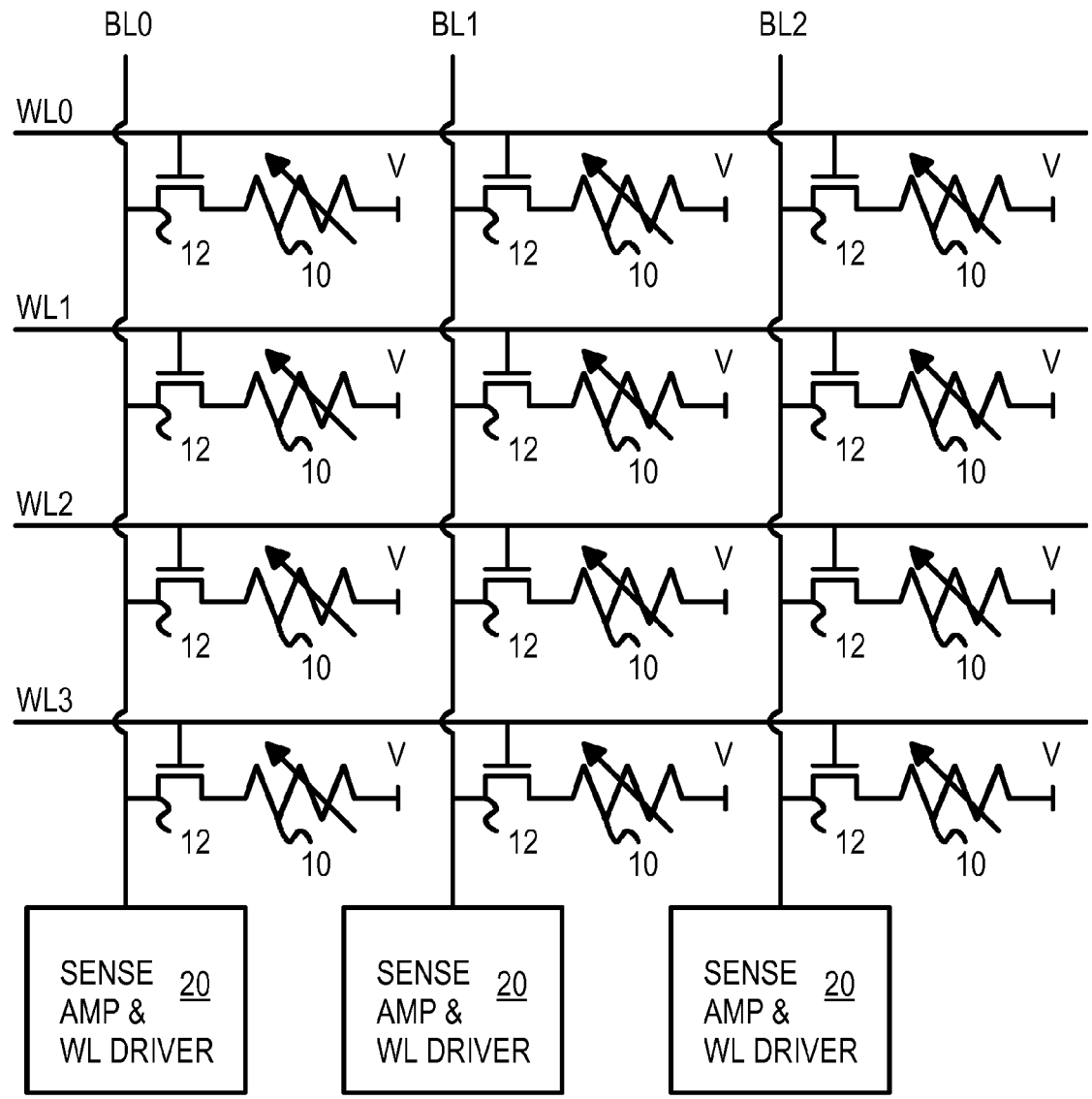
FIG. 3 shows an array of phase-change memory cells.

FIG. 3 shows an array of phase-change memory cells. Word lines WL0:3 are applied to the gates of select transistors 12, while bit lines BL0:2 connect to the drains of select transistors 12. Alloy resistors 10 are in series between the sources of select transistors 12 and a cell voltage V, which could be ground, power, or some other voltage, and could be switched on and off, such as for power down or to disable an array or block.

Alloy resistors 10 each can be in a high-resistance amorphous state, or in a low-resistance crystalline state. The current drawn from a bit line by select transistor 12 and alloy resistor 10 in the selected word line (row) is sensed by sense amplifiers 20 and amplified and buffered to generate the data read from the cell. The current drawn through alloy resistor 10 is less than or equal to the read current.

During writing, sense amplifiers 20 activate bit-line drivers that drive the set or reset current onto the bit lines and through the selected alloy resistor. After the current is applied for the set or reset time, alloy resistor 10 is transformed into the new state, either the amorphous or crystalline state. One cell per column is written, since only one of the word lines is activated at a time. Columns being written into the 0 state have the reset current applied to the bit line for the reset time period, while columns being written into the 1 state have the set current applied for the set time period.

Figure 4:
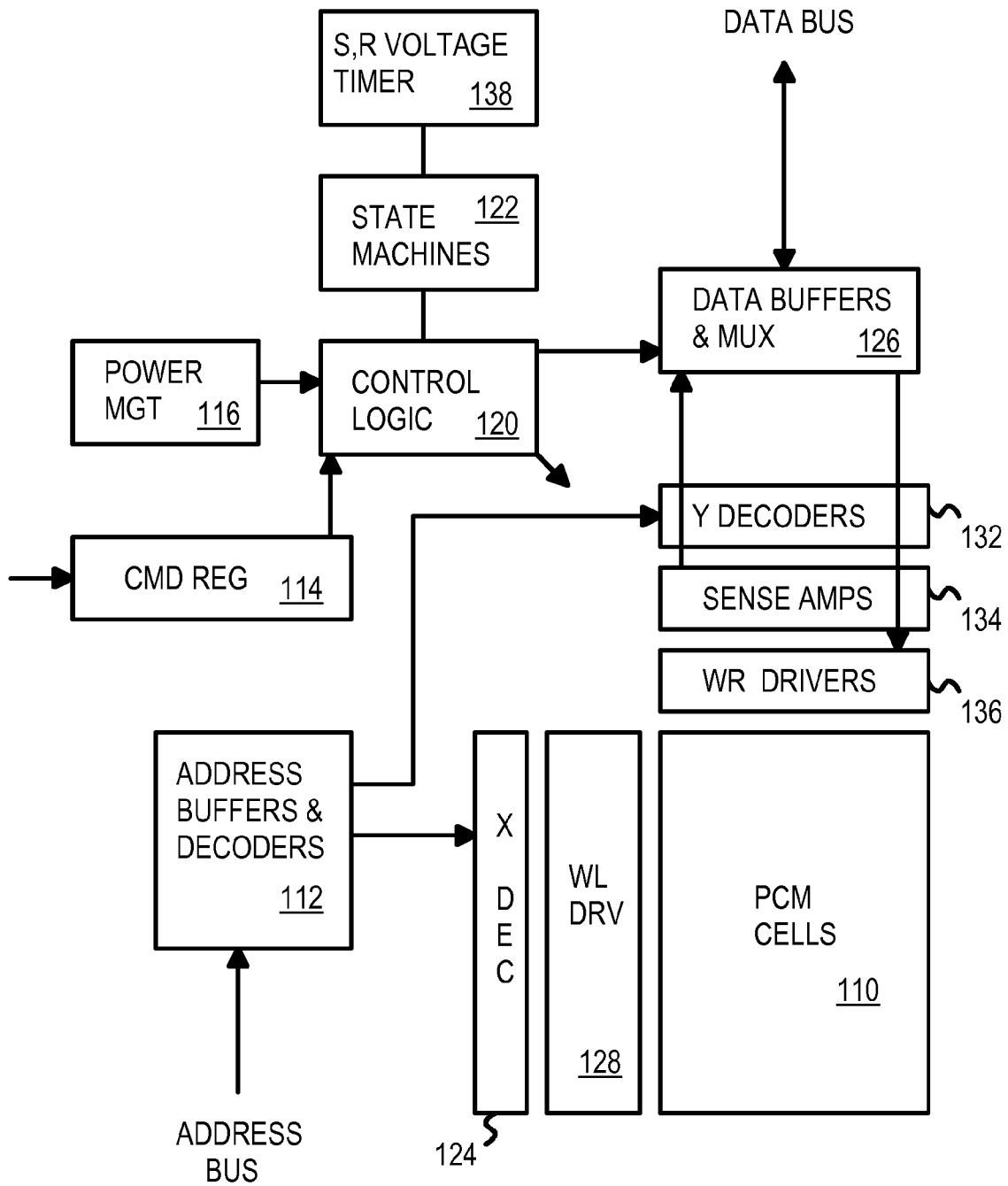
FIG. 4 shows a phase-change memory.

FIG. 4 shows a phase-change memory. A PCM chip may include some or all of the blocks shown in FIG. 4, and other blocks, or some of the functions may be performed by a separate PCM controller.

PCM cells 110 form an array of rows and columns of select transistors and alloy resistors that change between crystalline and amorphous phase states. The high and low resistance values of the 2 phase states are sensed by sense amplifiers 134 when a read current is drawn through a selected row of PCM cells. Word line drivers 128 drives one row or word line in PCM cells 110 while the other rows are disabled. A row portion of an address applied to address decoder 112 is further decoded by X decoder 124 to select which row to activate using word line drivers 128.

A column portion of the address applied to address decoder 112 is further decoded by Y decoder 132 to select a group of bit lines for data access. Data buffers 126 may be a limited width, such as 64 bits, while PCM cells may have a larger number of bit lines, such as 8×64 columns. One of the 8 columns may be selected by Y decoder 132 for connection to data buffers 126.

During writing, external data is collected by data buffers 126 and applied to write drivers 136. Write drivers 136 generate voltages or currents so that the set currents are applied to bit lines for PCM cells that are to be written with a 1, while higher reset currents are applied to bit lines for PCM cells to be reset to 0.

Set, reset voltage timer 138 includes timers that ensure that the set currents are applied by write drivers 136 for the longer set period of time, while the reset currents are applied for the shorter reset time period, and write drivers 136 for reset PCM cells are disabled after the reset time period. Both set and reset currents could be applied at the same time, such as for a period that the reset pulse overlaps the longer set pulse. Alternately, set and reset pulses could be non-overlapping. This may reduce peak currents, but increase write time. Since the reset time is perhaps one-tenth of the set time, write delays may increase by 10% or more.

State machines 122 can activate set, reset voltage timers 138 and cause control logic 120 to disable write drivers 136 after the set and reset time periods have expired. State machines 122 can generate various internal control signals at appropriate times, such as strobes to pre-charge bit lines and latch sensed data into data buffers 126.

Command register 114 can receive commands that are decoded and processed by control logic 120. External control signals such as read/write, data strobes, and byte enables may also be received in some embodiments. Command register 114 may be replaced by a command decoder in some embodiments. Power management unit 116 can power down blocks to reduce power consumption, such as when the PCM chip is de-selected. Since PCM cells 110 are non-volatile, data is retained when power is disconnected.

There may be several arrays of PCM cells 110 and associated logic on a large PCM chip. An array-select portion of the address can be decoded by address decoders 112 to enable one of the many arrays or blocks on the PCM chip.

Figure 5:
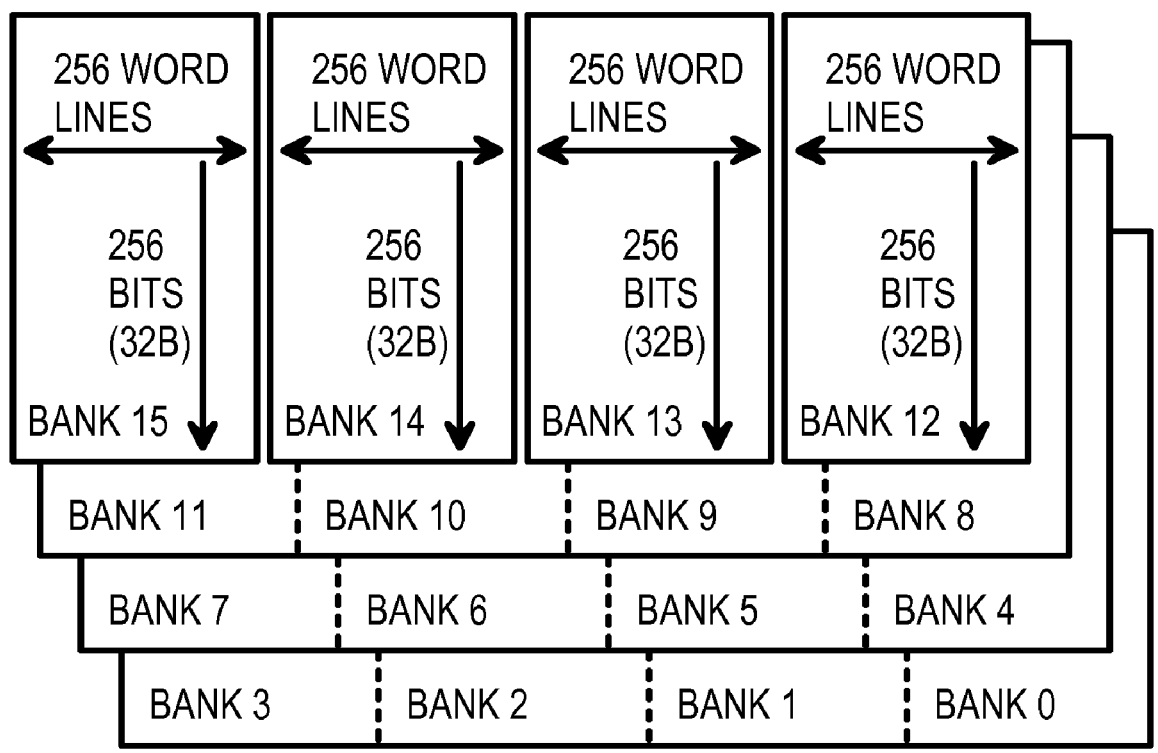
FIG. 5 shows an interleaved phase-change memory.
Figure 6:
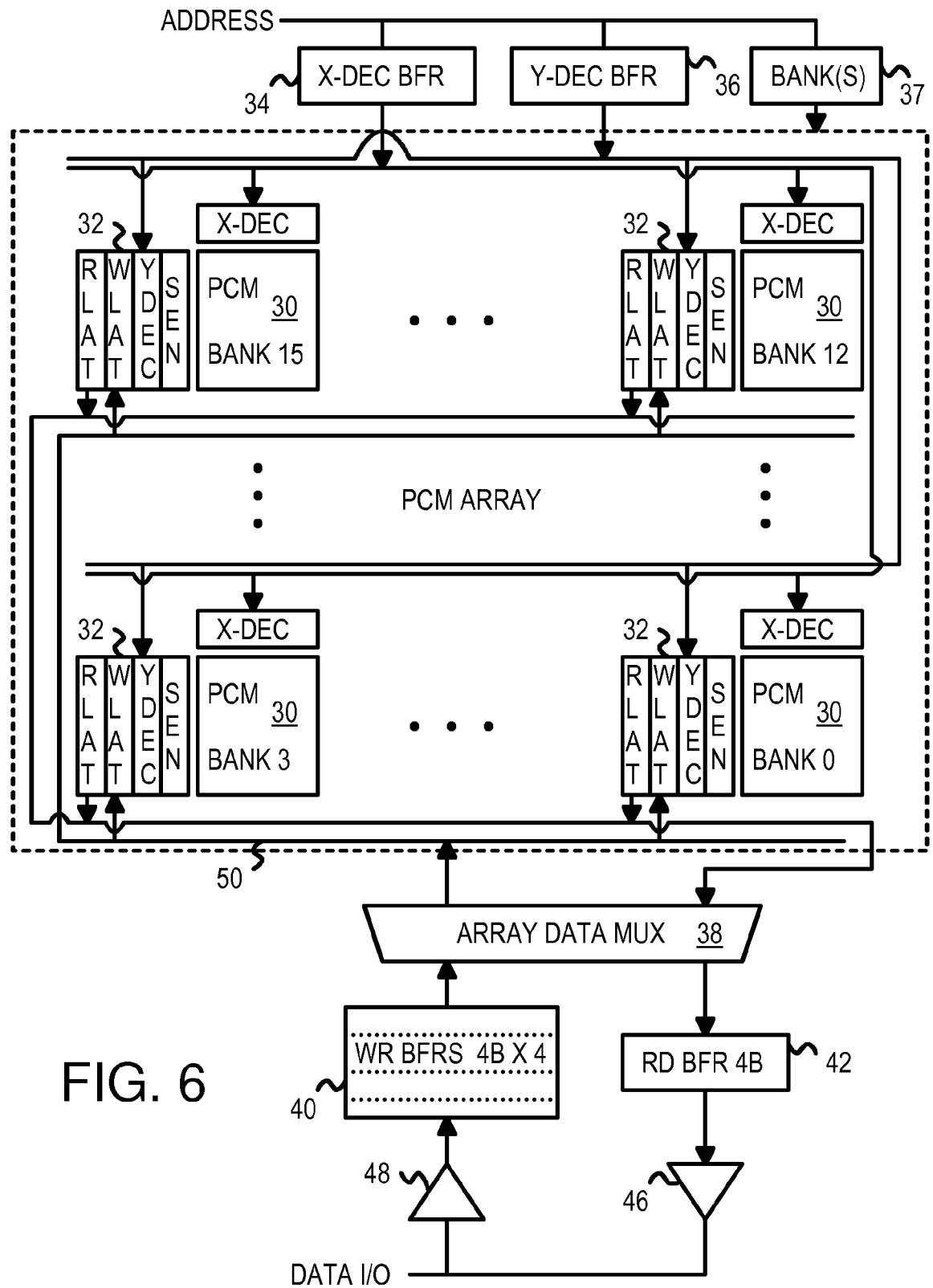
FIG. 6 shows local write latching at the interleaved banks forming a PCM array.
Figure 7:
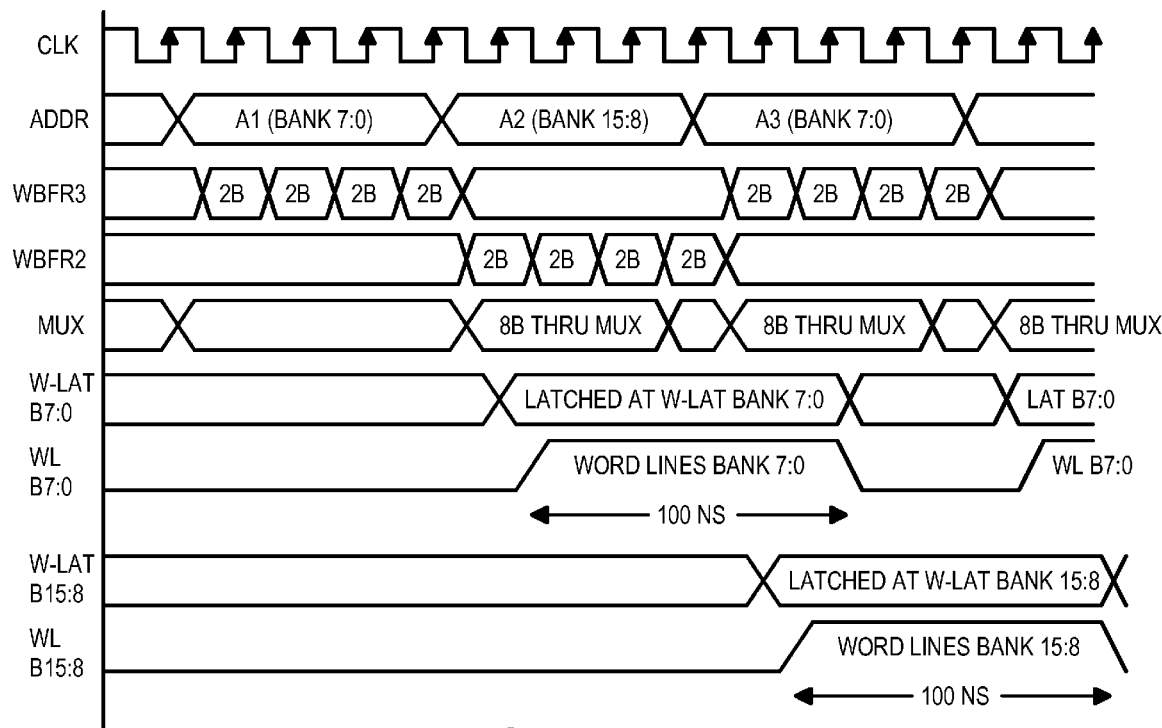
FIG. 7 is a waveform of concurrent writes using local write latches at interleaved banks of phase-change memory.

PCM Bank Interleaving—FIGS. 5-7

The inventors have realized that performance may be enhanced by interleaving arrays or banks of phase-change memories. Interleaving allows different banks to alternately write data during overlapping periods of time. To further improve the effectiveness of interleaving, local latching of write data at the banks allows the write data to be stored as close as possible to the memory cells being written. Data lines between banks are then freed up for transferring data to other banks. Thus the necessary routing resources can be reduced while still improving performance. The asymmetric write delays can be compensated for by interleaving and local write buffering.

FIG. 5 shows an interleaved phase-change memory. A 1 mega-bit memory is arranged as 16 banks, with each bank having 1M/16=64K bits. Each of the 16 banks has 256 word lines (rows) and 256 bit lines. The 256 bit lines can be arranged as 32 1-byte columns.

FIG. 6 shows local write latching at the interleaved banks forming a PCM array. The input address is divided into 3 parts. The upper 8 address bits in X-decode buffer 34 are applied to X-decoders to each of banks 30. The X-decoders select one of the 256 word lines in each of banks 30.

The middle 5 address bits in Y-decode buffer 36 are applied to Y-decoders to each of banks 30. The Y-decoders select one of the 32 byte-wide columns of bits lines in each of banks 30.

The lower 4 address bits in bank-address buffer 37 select one or more of the 16 banks for access. Additional logic, such as control logic or address sequencing logic (not shown), may alter the 4 address bits in bank-address buffer 37 to activate several of banks 30 at the same time to write in multiple bytes at a time.

Each bank 30 in the PCM array has an X-decoder and a Y-decoder to select one byte of memory cells for reading or writing. Sense amplifiers (SEN) each sense a pair of bit lines that connect to the memory cell to read a bit of data. The read data can be latched or buffered by read latch RLAT before being transferred over data lines to read buffer 42 through array data mux 38. Read data from read buffer 42 is driven off-chip by output buffers 46.

Write data enters the PCM chip through input buffers 48 and are stored in write buffers 40. Write buffers 40 can have four buffers of 4 bytes per buffer. The width each buffer in write buffers 40 can match the width of data lines 50 to the PCM array. When the width of the external Data I/O differs, two or more external bus cycles may be needed to fill each 4-byte buffer in write buffer 40. For example, a 16-bit external data bus requires 2 bus cycles to fill each 4-byte buffer in write buffers 40, while a 32-bit external bus requires only 1 bus cycle.

Each of banks 30 also contains a local bank write latch. The bits lines in each bank 30 are driven by write drivers from the data in bank write latch 32. Data from write buffers 40 are transferred to bank write latch 32 over data lines 50 through array data mux 38. Once the data is latched and stored in bank write latch 32, array data mux 38 can send different data over data lines 50, such as write data to other banks.

By providing bank write latch 32 for each of banks 30, the slow write process can be decoupled from data lines 50. Write drivers read the write data from bank write latch 32 and generate the set and reset currents onto the bit lines to write the data into the PCM cells in bank 30. Since the data is stored locally with each bank, the slow set-write process can occur concurrently with data transfers to other banks. Data throughput for slow phase-change writes into the crystalline state is vastly improved by local write-data storage at the interleaved banks. Sufficient time for growing crystals in the alloy resistors is provided without blocking other writes and data transfers.

FIG. 7 is a waveform of concurrent writes using local write latches at interleaved banks of phase-change memory. In this example, the external data bus is 16 bits, and 2 bytes are clocked into the PCM chip for each cycle of the 50 MHz clock.

The first access latches in address A1. Data D1 is loaded into write buffer WBFR3. Once all 8 bytes are latched in, the 8 bytes are passed through array data mux 38 and over data lines 50 to bank write latches 32 for banks 7:0. One byte is latched into the local bank write latch 32 for each of the 8 lower banks. The D1 data remains locally latched for about 6 clock cycles while the word lines are activated from decoding of the A1 address, and the bit lines drive the PCM cells with the set and reset currents. About 100 ns is needed for writing 1's to the cells. The set period of time can be 5×, 10×, or some other multiple of the reset period of time.

Once the D1 data has been latched into WBFR3, the next access cycle can begin. Address A2 is latched and data D2 is loaded into write buffer WBFR2. The 8 D2 bytes can be applied to the data lines after the D1 data has been locally latched into bank write latches 32 for banks 7:0. Since address A2 decodes to upper banks 15:8, the writes for addresses A1, A2 can be concurrent.

The D2 data is passed through array data mux 38 and onto data lines 50 after D1 has been latched, and after all 8 D2 bytes have been received from the host. The 8 D2 bytes are locally latched by bank write latches 32 at upper banks 15:8, with one byte latched per upper bank.

The D2 data remains locally latched for about 6 clock cycles while the word lines are activated from decoding of the A2 address, and the bit lines drive the PCM cells with the set and reset currents. About 100 ns is needed for writing 1's to the cells. However, this 100 ns for D2 (banks 15:8) overlaps with the prior 100 ns for D1 (banks 7:0).

The next access can begin without delay by latching address A3 and loading 8 bytes into WBFR3, when the address is for the lower banks. Wait states are not needed for accesses to sequential addresses as shown in this example.

Sequential accesses are common for large data transfers, so such interleaving can be effective. When back-to-back addresses occur that decode to the same bank, then wait states are still needed. Sequential accesses are common for many streaming and block-transfer applications such as media file transfers (digital cameras, videos, audio, etc.) and solid-state disks.

In this example with a 50 MHz clock and 2 bytes per cycle, 100 M bytes can be written per second, matching the external bus transfer rate. Wait states are not needed for sequential addresses. Without local bank write latching, more than 100 ns is needed per access, plus another clock cycle for address decoding prior to word line selection, and data rates can drop to around 17 M bytes per second.

When the external data width is increased to 4 bytes, the clock rate can be decreased to 30 MHz to save power and still attain a data rate of 120 M bytes per second. Without local buffering the data rate drops to 30 M bytes per second, even with the wider data interface.

Figure 8:
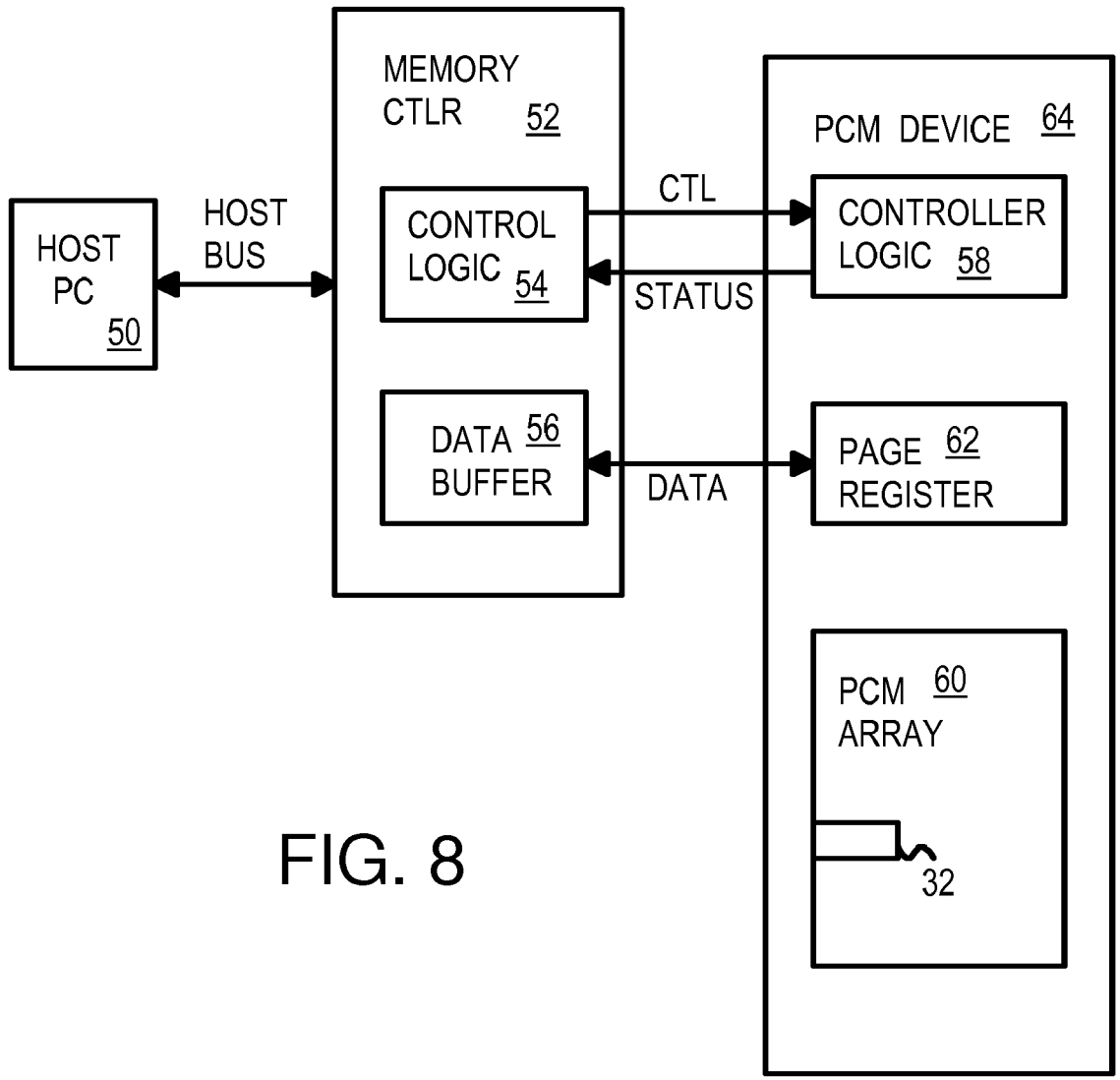
FIG. 8 is a block diagram of a solid-state-storage device that has a PCM controller and a PCM device.

FIG. 8 is a block diagram of a solid-state-storage device that has a PCM controller and a PCM device. A solid-state-storage device (SSD) such as a Multi Media Card (MMC) or Secure Digital (SD) card can be implemented. The MMC card has a PCM controller and one or more PCM memory devices. The PCM controller increases the throughput of the one or more PCM memory devices to match the speed of a host bus coupled to the MMC.

PCM controller 52 couples to host 50 over a host bus that has a command pin, a clock pin, and one or more data pins. PCM controller 52 also couples to PCM memory device 64 via an internal bus that transfers commands, status, and data. Note that the term PCM memory is used interchangeably with the terms PCM memory device and PCM memory devices.

PCM controller 52 includes data buffer 56 that stores data before being sent to host 50 over the host bus or to PCM memory device 64. PCM controller 52 also has control logic 54, which can detect and process commands on the host bus, and communicate with internal controller 58 in PCM memory device 64, such as by sending commands and reading status.

PCM memory device 64 includes internal controller 58, page register 62, and memory array 60. PCM controller 52 interfaces with PCM memory device 64 via a control bus, a status bus, and an input/output (I/O) or data bus. The bus may be a multiplexed bus, through which commands, addresses, and data are transmitted on shared lines.

Page register 62 interfaces with the PCM memory array 60 to write to or read the phase-change memory cells in PCM memory array 60. Set and reset pulses are generated for the set and reset periods of time, and with the set and reset voltages and currents.

In a read cycle, generally, PCM controller 52 sends a read command and an address to PCM memory device 64, which then asserts a busy signal or reports a busy status and transfers the data from PCM memory array 60 to page register 62. When the read transfer is complete, the busy signal is de-asserted to instruct PCM controller 52 to begin reading the data from page register 62 into data buffer 56. The data can then be sent from data buffer 56 in PCM controller 52 to host 50.

In a write cycle, generally, host 50 sends a command to PCM controller 52 and writes the host data into data buffer 56. PCM controller 52 sends a write command, address, and data to PCM memory device 64, and the data is stored from data buffer 56 into page register 62 before PCM memory device 64 asserts the busy signal while programming the data into PCM memory array 60. When programming (i.e., write) is complete, the busy signal is de-asserted. During the relatively slow programming or write of PCM memory cells in PCM memory array 60, data is transferred from page register 62 to bank write latch 32 for each bank of data, allowing that bank to continue writing from bank write latch 32 to the PCM memory cells while other data from page register 62 is transferred to other banks of PCM memory array 60, such as shown in FIGS. 5-7.

The performance of the read and write operations can be further improved by performing read-ahead and write-ahead operations as described later in the timing diagrams, FIGS. 13-23.

Figure 9:
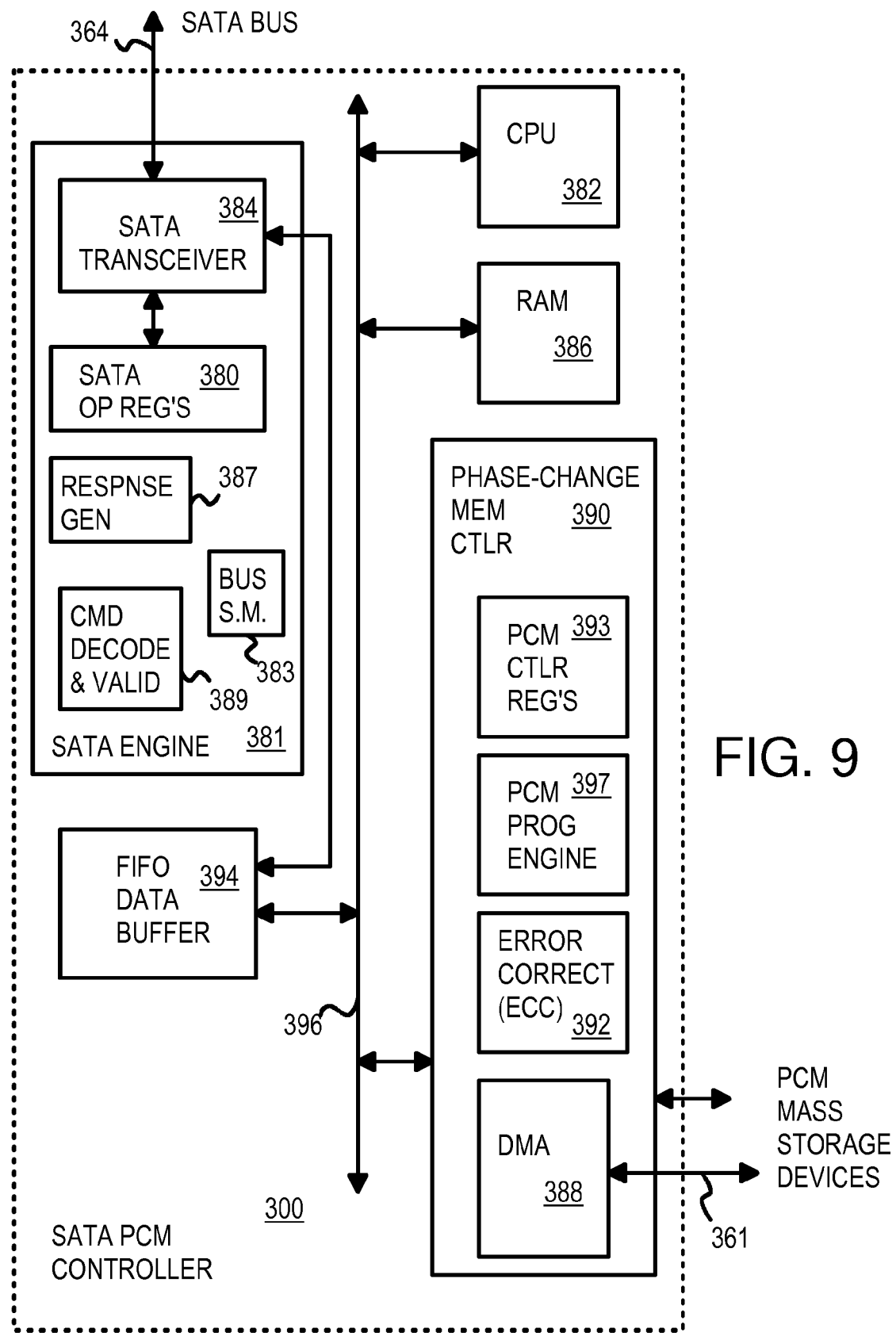
FIG. 9 is a block diagram of a SD controller for a phase-change memory solid state disk (SSD).
Figure 10:
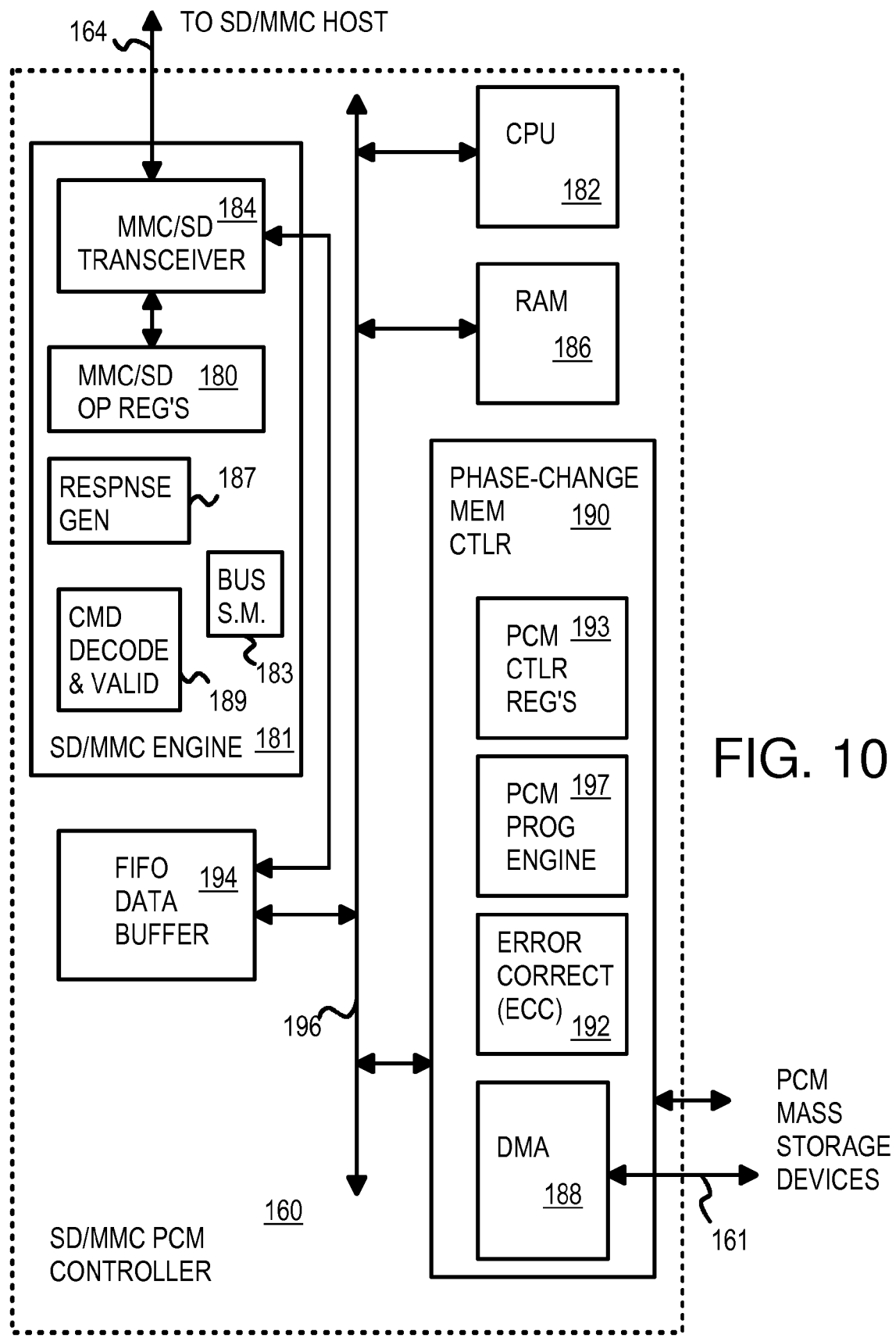
FIG. 10 is a block diagram of a Secure-Digital/Multi-Media Card (SD/MMC) controller for a phase-change memory device.

Peripherals Using PCM—FIGS. 9-10

FIG. 9 is a block diagram of a SD controller for a phase-change memory solid state disk (SSD). Rather than use a rotating magnetic hard disk for mass storage, the PC may use a solid state disk with flash memory replaced with phase-change memory for a PCM SSD. PCM controller 300 and its mass storage devices of phase-change memory chips could replace a solid-state disk (SSD).

The solid state disk (SSD) can have an array of PCM memory chips that form one or more PCM mass-storage devices. Each of the phase-change memory chips in the PCM mass-storage device can have the structure shown in FIGS. 3-4. These PCM memory chips communicate with single-chip PCM controller 300 over PCM bus 361. DMA engine 388 in PCM controller 390 writes and reads blocks of data in the array of PCM chips for the solid-state storage.

Inside PCM controller 300, SATA engine 381 is an interface to a Serial AT-Attachment (SATA) bus, such as SATA bus 364, which can connect to a south-bridge controller chip, or another bus chip in a host computer. Internal bus 396 connects CPU 382 with RAM 386, FIFO data buffer 394, direct-memory access (DMA) engine 388, and PCM controller 390. CPU 382 executes instructions from RAM 386, while DMA engine 388 can be programmed to transfer data between FIFO data buffer 394 and PCM controller 390. CPU 382 can operate on or modify the data by reading the data over bus 396. RAM 386 can store instructions for execution by the CPU and data operated on by the CPU.

SATA transceiver 384 connects to the clock CLK and parallel data lines of SATA bus 364 and contains both a clocked receiver and a transmitter. An interrupt to CPU 382 can be generated when a new command is detected on SATA bus 334. CPU 382 can then execute a routine to handle the interrupt and process the new command.

SATA operating registers 380 include the protocol registers required by the SATA specification. Registers may include a data-port, write-protect, memory select, memory status, interrupt, and identifier registers. Other extension registers may also be present.

Command decode and validator 389 detects, decodes, and validates commands received over SATA bus 334. Valid commands may alter bus-cycle sequencing by bus state machine 383, and may cause response generator 387 to generate a response, such as an acknowledgement or other reply.

The transmit and receive data from SATA engine 381 is stored in FIFO data buffer 394, perhaps before or after passing through a data-port register in SATA operating registers 380. Commands and addresses from the SATA transactions can also be stored in FIFO data buffer 394, to be read by CPU 382 to determine what operation to perform.

Phase-change-memory PCM controller 390 includes one or more of PCM control registers 393, DMA engine 388, PCM programming engine 397, and error-corrector 392. Data can be arranged to match the bus width of internal bus 396 or PCM bus 361, such as in 32, 64, or 128-bit words. DMA engine 388 can be programmed by CPU 382 to transfer a block of data between PCM bus 361 and FIFO data buffer 394.

PCM control registers 393 may be used in conjunction with DMA engine 388, or may operate independently. PCM-specific registers in PCM control registers 393 may include a data port register, interrupt, command and selection registers, address and block-length registers, and cycle registers. PCM control registers 393 include shadow registers that have a copy of the contents of registers in the PCM mass storage device.

Error-corrector 392 can read parity or error-correction code (ECC) from PCM storage chips and perform data corrections. The parity or ECC bits for data that is being written to PCM storage chips can be generated by error-corrector 392.

PCM programming engine 397 can be a state machine that is activated on power-up reset. PCM programming engine 397 programs DMA engine 388 within the address of the boot loader code in the first page of the PCM storage chip, and the first address in RAM 386. Then PCM programming engine 397 commands DMA engine 388 to transfer the boot loader from the PCM storage chip to RAM 386. CPU 382 is then brought out of reset, executing the boot loader program starting from the first address in RAM 386. The boot loader program can contain instructions to move a larger control program from the PCM storage chip to RAM 386. Thus SATA PCM controller 300 is booted without an internal ROM on internal bus 396. SATA PCM controller 300 can be part of a solid-state mass-storage device that mimics behavior of a rotating hard disk drive.

FIG. 10 is a block diagram of a Secure-Digital/Multi-Media Card (SD/MMC) controller for a phase-change memory device. A removable storage card that interfaces to a host PC can be constructed from phase-change memory rather than from flash memory. The removable card can operate using the secure digital (SD) interface, or using the Multi-Media Card (MMC) interface.

The removable storage device can have an array of PCM memory chips that form one or more PCM mass-storage devices. Each of the phase-change memory chips in the PCM mass-storage device can have the structure shown in FIGS. 3-4. These PCM memory chips communicate with single-chip PCM controller 160 over PCM bus 161. DMA engine 188 in PCM controller 190 writes and reads blocks of data in the array of PCM chips for the removable storage device.

Inside PCM controller 160, SD/MMC engine 181 is an interface to SD/MMC bus 164, which can connect to a southbridge controller chip, or another bus chip in a host computer. Internal bus 196 connects CPU 182 with RAM 186, FIFO data buffer 194, DMA engine 188, and PCM controller 190. CPU 182 executes instructions from RAM 186, while DMA engine 188 can be programmed to transfer data between FIFO data buffer 194 and PCM controller 190. CPU 182 can operate on or modify the data by reading the data over bus 196. RAM 186 can store instructions for execution by the CPU and data operated on by the CPU.

SD/MMC transceiver 184 connects to the clock CLK and data lines of SD/MMC bus 164 and contains both a clocked receiver and a transmitter. An interrupt to CPU 182 can be generated when a new command is detected on SD/MMC bus 134. CPU 182 can then execute a routine to handle the interrupt and process the new command.

SD/MMC operating registers 180 include the protocol registers required by the SD/MMC specification. Registers may include a data-port, write-protect, memory select, memory status, interrupt, and identifier registers. Other extension registers may also be present.

Command decode and validator 189 detects, decodes, and validates commands received over SD/MMC bus 134. Valid commands may alter bus-cycle sequencing by bus state machine 183, and may cause response generator 187 to generate a response, such as an acknowledgement or other reply.

The transmit and receive data from SD/MMC engine 181 is stored in FIFO data buffer 194, perhaps before or after passing through a data-port register in SD/MMC operating registers 180. Commands and addresses from the SD/MMC transactions can also be stored in FIFO data buffer 194, to be read by CPU 182 to determine what operation to perform.

Phase-change-memory PCM controller 190 includes one or more of PCM control registers 193, DMA engine 188, PCM programming engine 197, and error-corrector 192. Data can be arranged to match the bus width of internal bus 196 or PCM bus 161, such as in 12 or 128-bit words. DMA engine 188 can be programmed by CPU 182 to transfer a block of data between PCM bus 161 and FIFO data buffer 194.

PCM control registers 193 may be used in conjunction with DMA engine 188, or may operate independently. PCM-specific registers in PCM control registers 193 may include a data port register, interrupt, command and selection registers, address and block-length registers, and cycle registers. PCM control registers 193 include shadow registers that have a copy of the contents of registers in the PCM mass storage block.

Error-corrector 192 can read parity or error-correction code (ECC) from PCM storage chips and perform data corrections. The parity or ECC bits for data that is being written to PCM storage chips can be generated by error-corrector 192. PCM programming engine 197 can be a state machine that is activated on power-up reset. PCM programming engine 197 programs DMA engine 188 within the address of the boot loader code in the first page of the PCM storage chip, and the first address in RAM 186. Then PCM programming engine 197 commands DMA engine 188 to transfer the boot loader from the PCM storage chip to RAM 186. CPU 182 is then brought out of reset, executing the boot loader program starting from the first address in RAM 186. The boot loader program can contain instructions to move a larger control program from the PCM storage chip to RAM 186. Thus SD/MMC PCM controller 160 is booted without an internal ROM on internal bus 196. SD/MMC PCM controller 160 can be part of a removable storage device that mimics behavior of a rotating hard disk drive.

Figure 11:
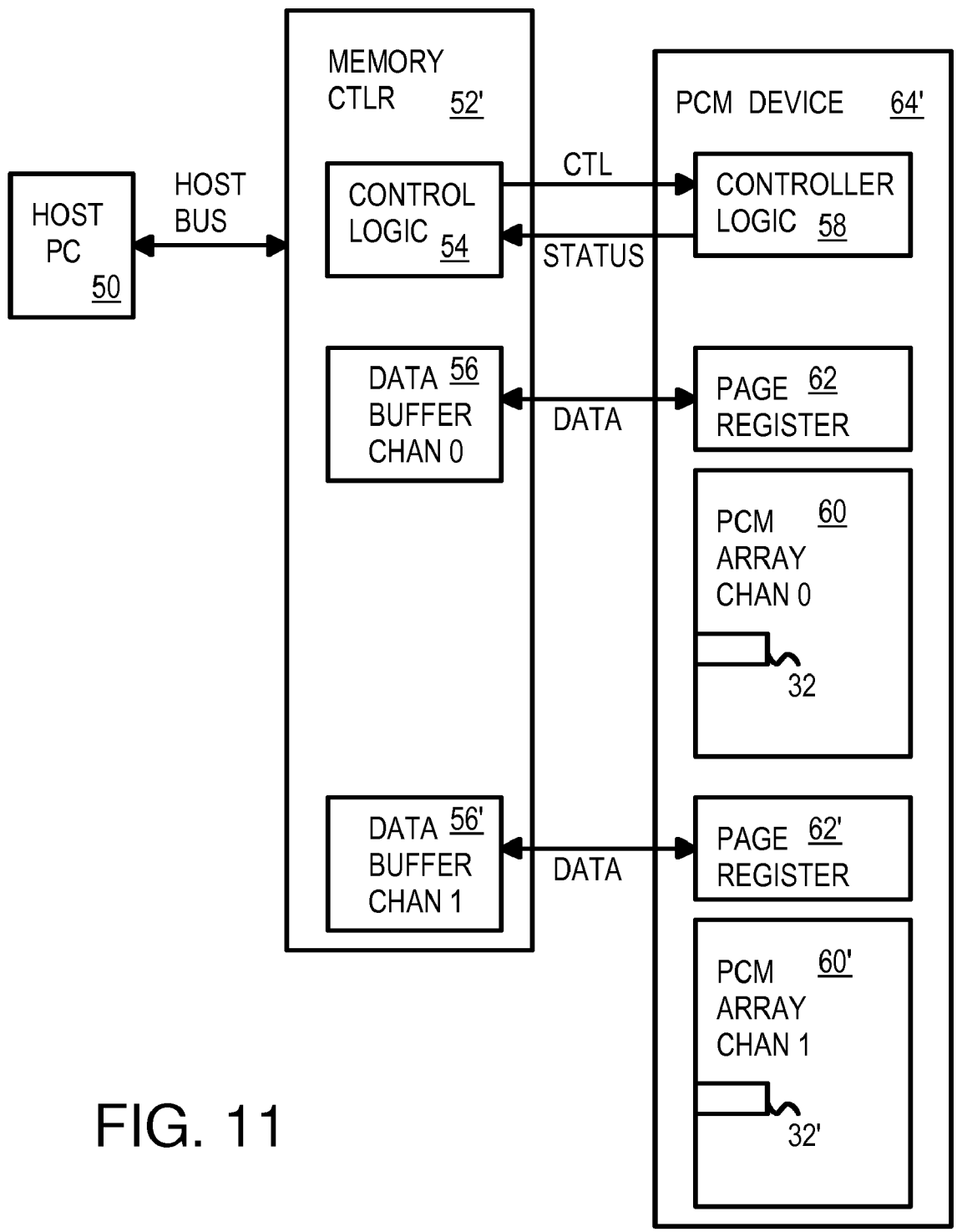
FIG. 11 is a block diagram of a dual-channel solid-state-storage device that has a PCM controller and a PCM device.
Figure 12:
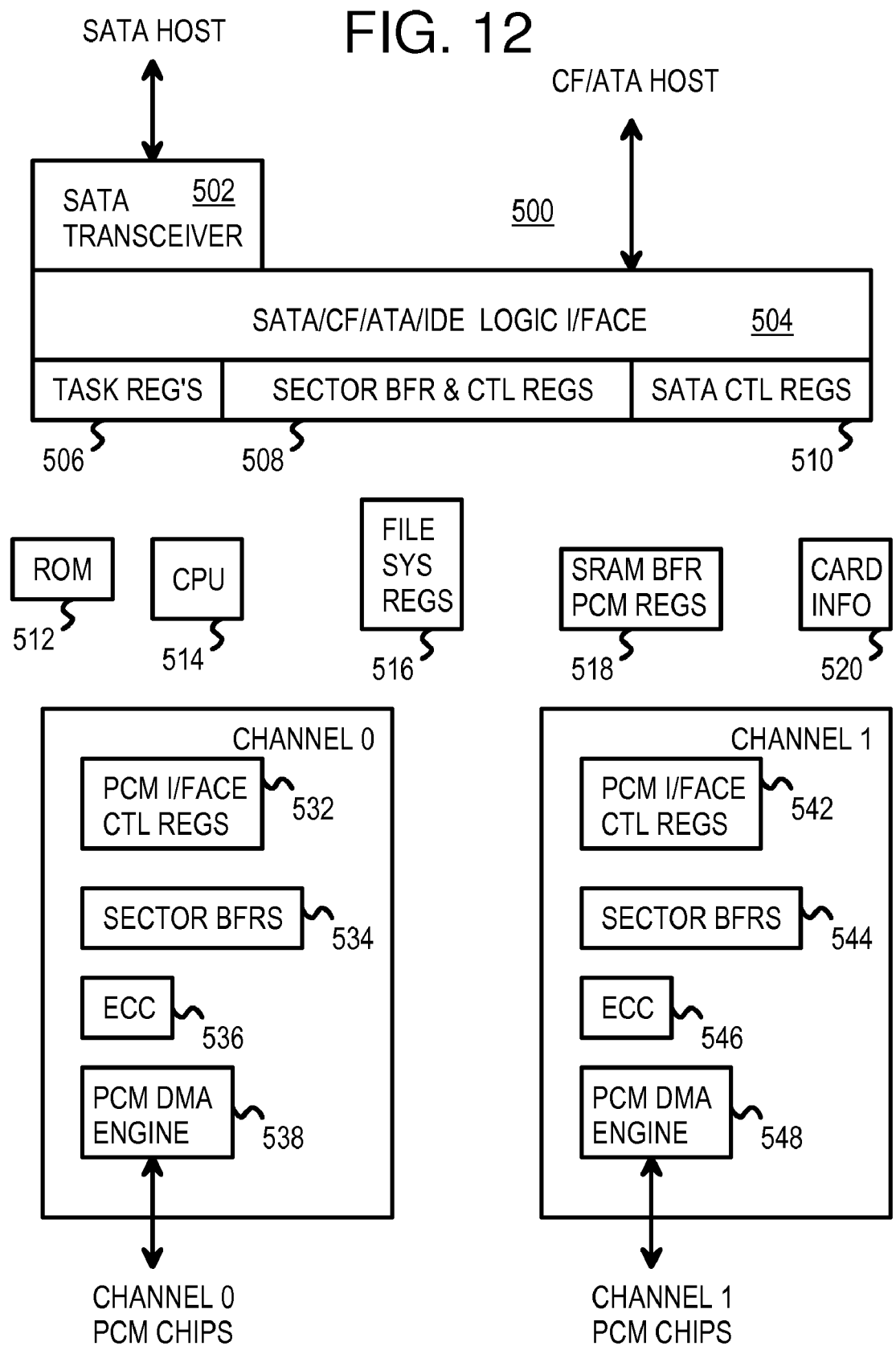
FIG. 12 shows a dual-channel PCM peripheral device.

Dual-Channel PCM Peripherals—FIGS. 11-12

FIG. 11 is a block diagram of a dual-channel solid-state-storage device that has a PCM controller and a PCM device. A solid-state-storage device (SSD) such as a Multi Media Card (MMC) or Secure Digital (SD) card can be thus implemented.

Having dual channels can significantly improve performance of the SSD. PCM controller 52' has two data buffers

56, 56' for channel 0 and channel 1, respectively, which are for accessing two PCM memory arrays 60, 60', respectively.

Writes of host data to channel 0 of the SSD are stored in data buffer 56 before being transferred to page register 62. Then the data is transferred from page register 62 to successive bank write latches 32 in PCM memory array 60, and finally the slower set and reset pulses are applied to write the data from bank write latches 32 into the PCM memory cells in the banks of PCM memory array 60. Data is read from PCM memory array 60 into page register 62, and then transferred to data buffer 56 before being returned to host 50 over the host bus.

For channel 1, writes of host data are stored in data buffer 56' before being transferred to page register 62'. Then the data is transferred from page register 62' to successive bank write latches 32' in PCM memory array 60', and finally the slower set and reset pulses are applied to write the data from bank write latches 32' into the PCM memory cells in the banks of PCM memory array 60'. Data is read from PCM memory array 60' into page register 62', and then transferred to data buffer 56' before being returned to host 50' over the host bus.

While separate PCM memory devices 64 could be used, a combined dual-channel PCM memory device 64' is shown. Internal controller 58 can return status for both channels and can process commands for both channels. PCM controller 52' includes control logic 54, which can detect and process commands on the host bus, and communicate with internal controller 58 in PCM memory device 64', such as by sending commands and reading status.

The performance of the read and write operations for either channel can be further improved by performing read-ahead and write-ahead operations as described later in the timing diagrams, FIGS. 13-23.

FIG. 12 shows a dual-channel PCM peripheral device. The very long set pulse time for writing a 1 into the PCM memory cells can reduce performance when writing data into the PCM peripheral. Rather than arrange the phase-change memory chips into one block, two PCM blocks can be formed, each with its own data-transfer channel. Having dual channels to dual PCM blocks allows operations to be performed independently and concurrently on the two PCM blocks, improving performance.

When dual-channel peripheral device 500 connects to a SATA host, SATA transceiver 502 receives commands and write data from the SATA host, and sends back read data and status to the host by receiving and sending physical signals. When dual-channel peripheral device 500 connects to an ATA, IDE, or Compact Flash (CF) host, the host bus connects directly to interface 504. Interface 504 includes the physical signal interfaces and response-generation logic to respond to the host using a selected host-bus protocol. Interface 504 receives commands and write data from the host, and sends back read data and status to the host by receiving and sending physical signals.

The host may write and read a variety of protocol registers. Operations to be performed can be written into task registers 506, while sector data and control information can be written into sector buffer and control registers 508. SATA control registers 510 are used for SATA-specific control information.

The sector write data from sector buffer and control registers 508 can be transferred to either sector buffer 534, when channel 0 is being written, or to sector buffer 544 when channel 1 is being written. Control information from task registers 506 and/or sector buffer and control registers 508 are examined by central processing unit CPU 514, which reads and executes one or more routines in ROM 512 to perform the desired command from the host. PCM-specific commands and control information is written by CPU 514 into PCM interface control registers 532 when channel 0 is being accessed, or into PCM interface control registers 542 when channel 1 is being accessed. The choice of channels may be determined by decoding an address, or by CPU 514 using various criteria such as usage of the 2 channels and block re-mapping. File system registers 516 may be examined and updated to keep a catalog of files stored in phase-change memory chips in the 2 channels. Metadata, file names, read/write permissions and other file-specific information may also be maintained.

Once a channel is activated by CPU 514, such as by writing a start command to set a flag in PCM interface control registers 532, 542, the channel begins the data transfer. For a write to channel 0, data is read from sector buffer 534, error-correction code (ECC) is generated and attached to the data by ECC block 536, and PCM DMA engine 538 transfers the data to the external phase-change memory chips which generate the set and reset pulses to write the data into the PCM cells by melting or re-crystallizing the alloy resistors. A write to channel 1 is performed in a similar manner using sector buffer 544, ECC block 546, and PCM DMA engine 548.

For a read to channel 1, once CPU 514 initiates the transfer with a start command flag, PCM DMA engine 548 reads data from the phase-change memory chips, and ECC block 546 checks the data for errors using appended ECC bytes, which are stripped off the data. Error correction may also be performed using the ECC bytes. The corrected data is written into sector buffer 544, and the transfer status is updated in PCM interface control registers 542. Once the transfer is complete, CPU 514 transfers the read data from sector buffers 544 to sector buffer and control registers 508 for transfer to the host by interface 504.

SRAM buffer 518 may be used as an intermediate buffer for data and PCM-register information. Read and/or write data could be buffered by SRAM buffer 518, or only PCM register information. Card information 520 contains card identifier and configuration information that the host can access. Dual-channel peripheral device 500 and its mass storage devices of phase-change memory chips could replace a solid-state disk.

Timing Diagrams for PCM Controller—FIGS. 13-23

The PCM controller increases the throughput of the flash memory devices to match the speed of a host bus coupled to the MMC. A memory card that has a 4-bit MMC bus operating at 20 MHz is described in these timing diagrams, but other speeds and buses could be substituted.

In accordance with the present invention, the read and write operations are described in more detail below.

Read Operations

Figure 13:
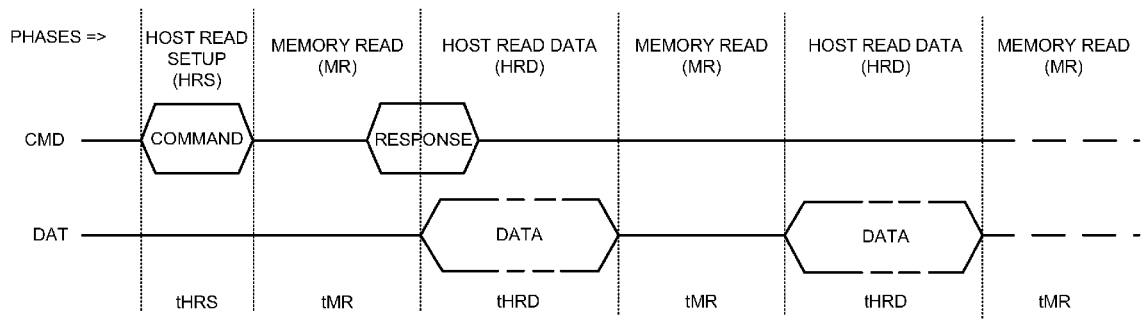
FIG. 13 is a high-level timing diagram of a multiple-block host read operation.

FIG. 13 is a high-level timing diagram of a multiple-block host read operation. The basic read operation begins with a host read setup phase, in which the PCM controller receives a read command from the host. The PCM controller returns a response in a later phase if it is ready.

In a subsequent memory read phase, the PCM controller begins a memory read cycle to the phase-change memory. Once the data is ready, the PCM controller sends data to the host in a host read data phase. One command may require many memory read and host read data phases, such as for block read commands.

Figure 14:
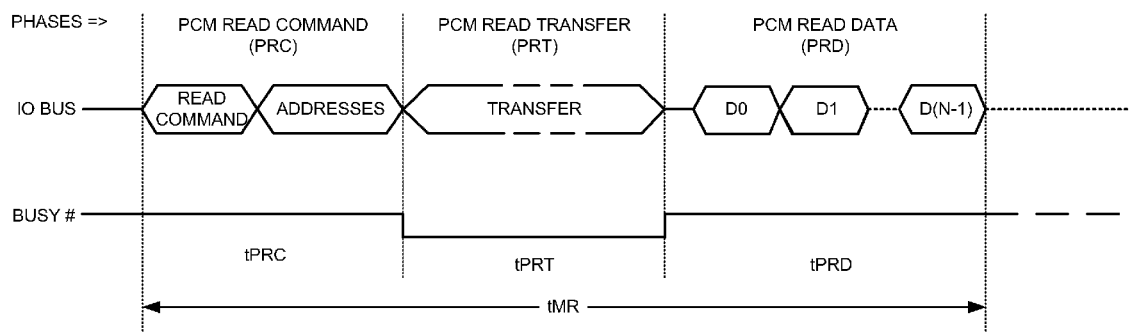
FIG. 14 is a detailed timing diagram of a phase-change memory read operation.

FIG. 14 is a detailed timing diagram of a phase-change memory read operation. FIG. 14 corresponds to the memory read phase (MR) of FIG. 13. First the PCM controller issues a read command to the phase-change memory. Upon receiving the read command, the phase-change memory transfers the data from the memory array to the page register. Once the data is ready, the PCM controller reads the data into its data buffer before the data is sent to the host.

The typical read operating conditions of the host and phase-change memory are as follows:

MMC host cycle time=50 ns (at operating frequency—20 Mhz),

MMC host data width-4,

Phase-change memory cycle time=50 ns,

Phase-change memory page size=512B.

Figure 15:
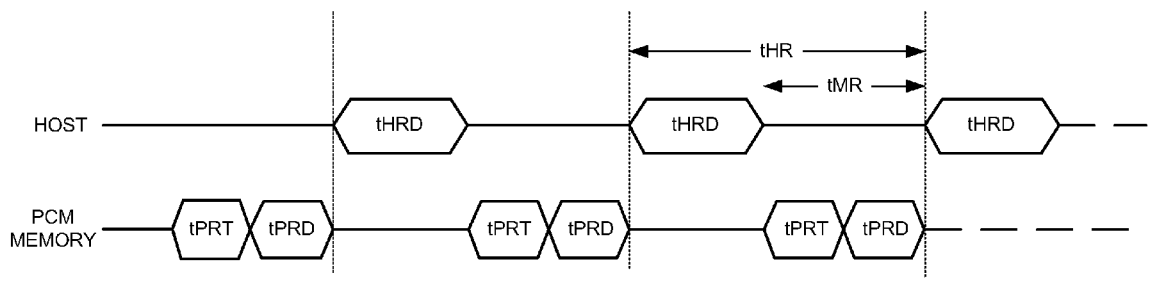
FIG. 15 shows a timing diagram of a typical memory read operation.

The typical timing of each phase in the read operation is as follows:

Host read setup time (tHRS),

Host read data time (tHRD),

PCM read command time (tPRC),

PCM read transfer time (tPRT),

PCM read data time (tPRD),

FIG. 15 shows a timing diagram of a typical memory read operation. The host read setup time (tHRS) and the PCM read command time (tPRC) are negligible for sequential read access. As such:

The memory read time (tMR)–tPRT+tPRD,

The sequential host read time (tHR)=tMR+tHRD,

The sequential host read speed (SHRS)=(No. of bytes)/ tHR

A reduction of the memory read time (tMR) improves the read speed. In accordance with the present invention, the following methods are applied in the PCM controller to increase the read speed.

1. Read-Ahead Memory Read Operation

Figure 16:
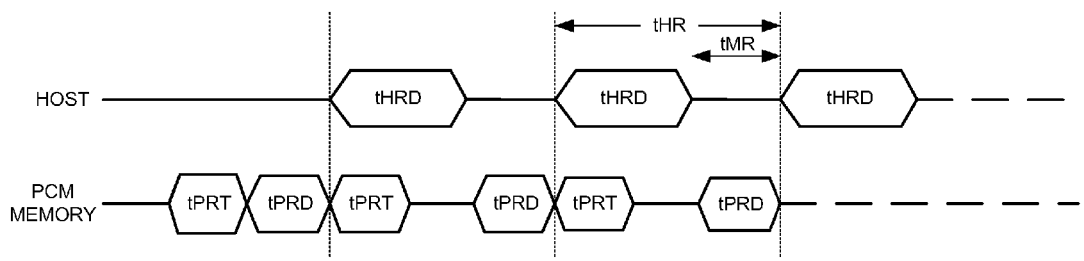
FIG. 16 shows a timing diagram of a read-ahead memory read operation.

FIG. 16 shows a timing diagram of a read-ahead memory read operation. As is shown, the PCM controller sends the read command to the phase-change memory to begin the data transfer (tPRT) while the host is reading (tHRD) from the buffer in the PCM controller the previous data read from the phase-change memory. Once the buffer is emptied, the PCM controller immediately reads (tPRD) the next data from the phase-change memory into the buffer for delivery to host. For back-to-back read cycles, the effective memory read time (tMR) is equal to the PCM read data time (tPRD). As such:

tMR=tPRD, tHR=tMR+tHRD,

The sequential host read speed (SHRS)=(No. of bytes)/ tHR has a speed increase over the typical sequential host read speed.

Larger Page Memory Read Operation

In accordance with the present invention, the size of the page register of the phase-change memory is enlarged such that a greater number of bytes can be transferred from the memory array to the page register over a certain period of PCM read transfer time (tPRT). The throughput between the memory array to the page register is hence increased which in turn raises the overall read speed.

The size of the page register can be increased even more to increase the read speed to match the speed of the host bus. For example, the size of the page register can be increased to 4096 bytes, 8192 bytes, or more, depending on the specific application.

To support a larger page size of 2048 bytes, the host will set the block length to 2048 bytes before commencing host read cycles. The corresponding timing is as follows:

tPRD (2048 bytes), tHRD (2048 bytes), tMR=tPRT+tPRD, tHR=tMR+tHRD,

The sequential host read speed (SHRS)=(No. of bytes)/ tHR has a speed increase over the typical sequential host read speed.

Wider Data Bus Read Operation

In accordance with the present invention, the width of data bus is widened such that a greater number of bytes can be read from phase-change memory to PCM controller via the bus at any instance, so the effective PCM read data time (tPRD) is therefore reduced. The throughput between PCM controller and phase-change memory is hence increased which in turn raises the overall read speed. In a specific embodiment, for a fixed or certain amount of data bytes, a phase-change memory with a 16-bit data bus uses half of the PCM read data time (tPRD) than a phase-change memory with an 8-hit data bus. The data bus size can be increased even more to increase the memory read speed to match the speed of the host bus. For example, the data bus size can be increased to 32 bits, or 64 bits, or more, depending on the specific application.

The typical phase-change memory data bus width is 8 bits, with the wider data bus, the PCM read data time (tPRD) is reduced and the speed is higher. For example, when the phase-change memory with 2048-byte page and 16-bit data bus width is used, the timing is as follows:

tPRD (16 bits), tMR=tPRT+tPRD tHR=tMR+tHRD,

The sequential host read speed (SHRS)=(No. of bytes)/ tHR has a speed increase over the typical sequential host read speed.

Dual-Channel Concurrent Memory Read Operation

The PCM controller may be designed with two chip enables or selects, each chip enable controlling a phase-change memory device or channel. The data is stored in both phase-change memory devices in an interleaved manner. During the data transfer state, the phase-change memory device informs the PCM controller via its individual busy signal if the data is ready. While separate PCM memory devices are described, they may be separate channels in a single PCM memory device as shown in FIG. 11.

Figure 17:
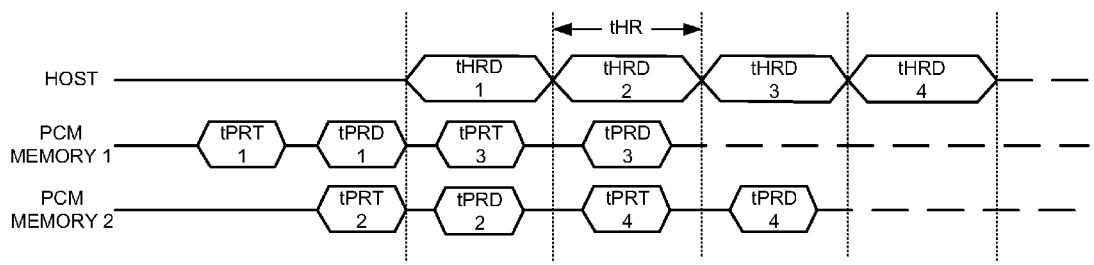
FIG. 17 shows a timing diagram of a dual-channel concurrent memory read operation.

FIG. 17 shows a timing diagram of a dual-channel concurrent memory read operation. As is shown, after a read command is issued to one of the phase-change memory devices (e.g., Phase-change memory 1) to begin an internal data transfer (tPRT3) from a memory array to the page register, the PCM controller enables the other phase-change memory device (Phase-change memory 2) to read data (tPRD2) available corresponding to the previous read command via the phase-change memory data bus. As a result, the chip selects allow for multiple PCM memories to be concurrently accessed. Accordingly, read concurrency is achieved among multiple PCM memories. This concurrency effectively eliminates the memory read time (tMR) at the host bus. As such:

tHR=tHRD,

The sequential host read speed (SHRS)=(No. of bytes)/ tHR operates at the full speed of host bus.

Write Operations

Figure 18:
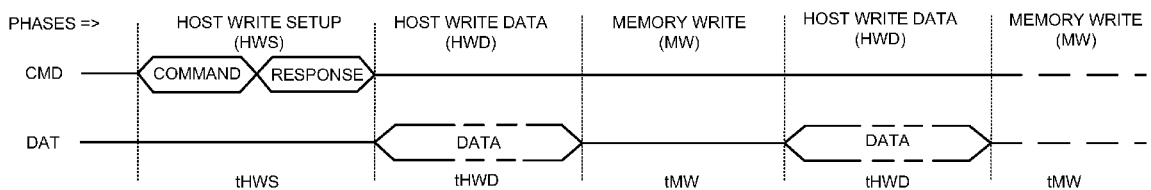
FIG. 18 shows a high-level timing diagram of a multiple-block host write operation.

FIG. 18 shows a high-level timing diagram of a multiple-block host write operation. The basic write operation begins with a host write setup phase, in which the PCM controller receives the write command from the host. After a response is received, host delivers data to the PCM controller. The memory write phase is followed, in which the PCM controller begins memory write cycle to program data into the phase-change memory.

Figure 19:
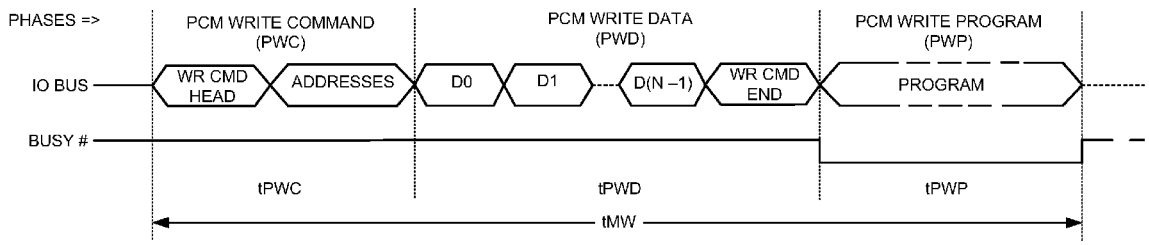
FIG. 19 shows a detailed timing diagram of a phase-change memory write operation.

FIG. 19 shows a detailed timing diagram of a phase-change memory write operation. FIG. 19 corresponds to the memory write phase (MW) of FIG. 18. After a write command is issued, the PCM controller delivers data to fill the page register in the phase-change memory, which then programs the data into the memory array.

The typical write operating conditions of the host and phase-change memory:

MMC host cycle time=50 ns (at operating frequency=20 Mhz),

MMC host data width-4,

Phase-change memory cycle time=50 ns, Phase-change memory page size=512B.

The typical timing of each phase in write operation is as follows:

Host write setup time (tHWS),
Host write data time (tHWD),
PCM write command time (tPWC),
PCM write program time (tPWP),
PCM write data time (tPWD).

Figure 20:
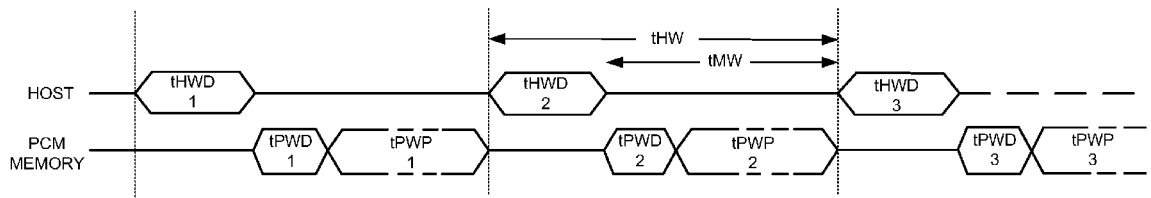
FIG. 20 shows a timing diagram of a typical memory write operation.

FIG. 20 shows a timing diagram of a typical memory write operation. The host write setup time (tHWS) and the PCM write command time (tPWC) are negligible for sequential write cycles. As such:

The memory write time (tMW)=tPWD+tPWP,
The sequential host write time (tHW)=tHWD+tMW,
The sequential host write speed (SHWS)=(No. of bytes)/tHW. The speed is much less than the MMC host bandwidth.

Accordingly, a reduction of the memory write time (tMW) improves write speed. The following methods are applied in the PCM controller to increase the write speed.

Write-Ahead Memory Write Operation

Figure 21:
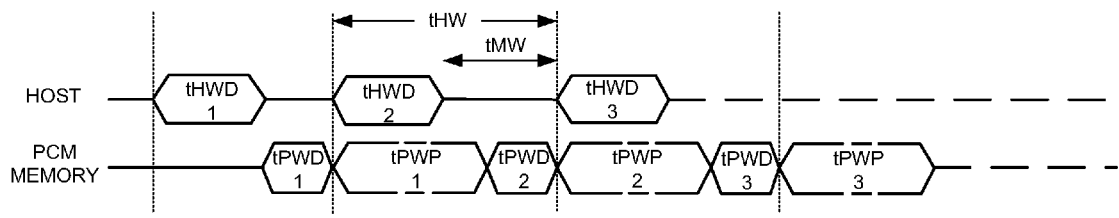
FIG. 21 is a timing diagram of a write-ahead memory write operation.

FIG. 21 is a timing diagram of a write-ahead memory write operation. As is shown, once the previous data has been emptied (tPWD,) to phase-change memory, the host begins writing (tHWD,) the next data to PCM controller, while the previous data being programmed (tPWP,) to the memory array in phase-change memory. For back-to-back write cycles, the effective memory write time (tMW) is reduced by the host write data time (tHWD). As such:

tMW=tPWD+tPWP-tHWD,
tHW=tPWD+tPWP,

The sequential host write speed (SHWS)=(No. of bytes)/tHW has a speed increase over the typical sequential host write speed.

Larger Page Memory Write Operation

The size of the page register of the phase-change memory is enlarged such that a greater number of bytes can be programmed from the page register to the memory array over a certain period of PCM write program time (tPWP). The throughput between the page register to the memory array is hence increased which in turn raises the overall write speed.

The size of the page register can be increased even more to increase the write speed to match the speed of the host bus. For example, the size of the page register can be increased to 4096 bytes, 8192 bytes, or more, depending on the specific application.

To support a larger page, the host will set the block length to 2048 bytes before host write cycles. The corresponding timing is as follows:

tPWD (2048 bytes),
tHWD (2048 bytes),
tMW=tFWD+tFWP,
tHW=tHWD+tMW,

The sequential host write speed (SHWS)=(No. of bytes)/tHW has a speed increase over the typical sequential host write speed.

With the write-ahead operation, the memory write time (tMW) is further reduced by the host write data time (tHWD). The timing is as follows:

tMW=tPWD+tPWP-tHWD,
tHW=tPWD+tPWP,

The sequential host write speed (SHWS)=(No. of bytes)/tHW has a speed increase over the typical sequential host write speed.

Wider Data Bus Write Operation

The width of the data bus is widened such that a greater number of bytes can be written from the PCM controller to the phase-change memory via the bus at in any instance, the effective PCM write data time (tPWD) is therefore reduced. The throughput between the PCM controller and the phase-change memory is hence increased which in turn raises the overall write speed. In a specific embodiment, for a fixed or certain amount of data bytes, the phase-change memory with 16-bit data width uses half of the PCM write data time (tPWD) than the phase-change memory with an 8-bit data bus. The data bus size can be increased even more to increase the memory write speed to match the speed of the host bus. For example, the data bus size can be increased to 32 bits, or 64 bits, or more, depending on the specific application.

The typical phase-change memory data bus width is 8-bits, with the wider data bus, the PCM write data time (tPWD) is reduced and the speed is higher. For example, when the phase-change memory with 2048-byte page and 16-bit data bus width is used, the timing is as follows:

tMW=tPWD (16 bits)+tPWP,
tHW=tHWD+tMW,

The sequential host write speed (SHWS)=(No. of bytes)/tHW has a speed increase over the typical sequential host write speed.

Dual-Channel Concurrent Memory Write Operation

The PCM controller is designed with two chip enables or selects, each chip enable controls a phase-change memory or channel and the data are stored in both PCM memories in an interleaved manner. During the data program state, the phase-change memory informs PCM controller via its individual busy signal when the program is done.

Figure 22:
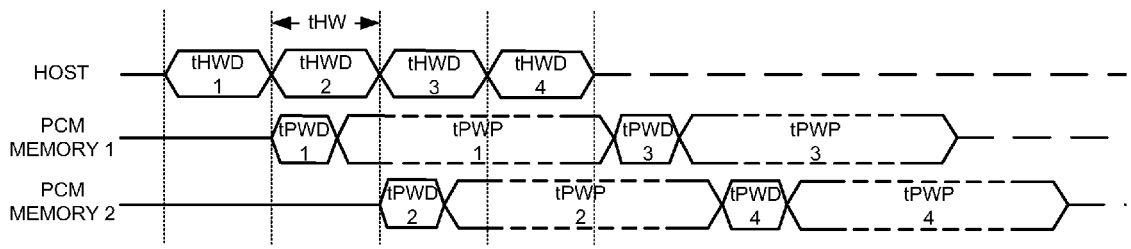
FIG. 22 is a timing diagram of a dual-channel concurrent memory write operation.

FIG. 22 is a timing diagram of a dual-channel concurrent memory write operation. As is shown, the PCM controller enables one of the phase-change memory devices (e.g., Phase-change memory 2) to fill its page register (tPWD2) via phase-change memory data bus while the other phase-change memory (Phase-change memory 1) is programming (tPWP1) the memory array with the data previously sent from the PCM controller. The write concurrency is achieved among PCM memories. This concurrency effectively eliminates the memory write time (tMW) at the host bus. As such:

tHW=tHWD,

The sequential host write speed (SHWS)=(No. of bytes)/tHW is at the full speed of host bus.

Write-Cache Memory Write Operation

The phase-change memory may have a cache register in addition to a page register to pipeline extra data to be programmed into the memory array. While hundreds of microseconds are needed to move the data from the page register to the memory array, it takes only few microseconds to move data from the cache register to the page register. Such pipelining allows for the concurrency of memory write data and the memory program phases, which reduces the effective memory write time (tMW) at the host bus.

Figure 23:
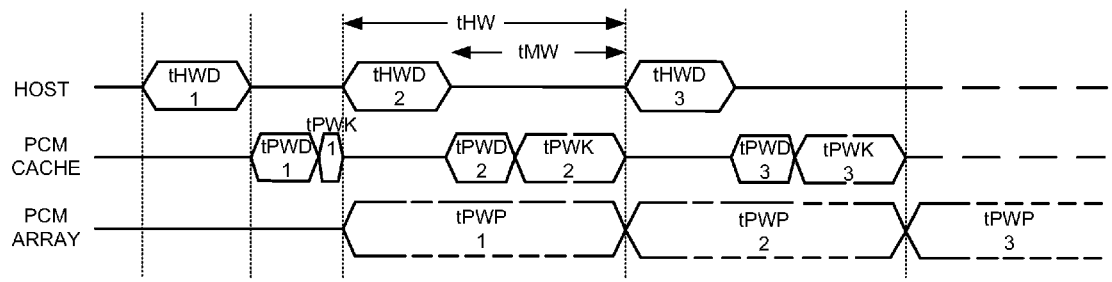
FIG. 23 is a timing diagram of a write-cache memory write operation.

FIG. 23 is a timing diagram of a write-cache memory write operation. For write operations, the data is first written (tPWD,) to the cache register. Once the cache register has emptied (tPWKi) the data to page register, it is ready to accept the next data (tPWD2) from PCM controller while the previous data in page register is being programming (tPWP1) into the memory array.

For back-to-back write cycles, the effective memory write time (tMW) is the PCM write program time (tPWP)—the host write data time (tHWD). As such:

tMW=tPWP−tHWD,
tHW=tHWD+tMW=tPWP,

The sequential host write speed (SHWS)=(No. of bytes)/tHW has a speed increase.

For 2048-byte phase-change memory, as the host write data time (tHWD) is long comparable to the PCM write program time (tPWP), the effective memory write time (tMW) is the PCM write data time (tPWD)+PCM write cache time (tPWK). With the PCM write cache time (tPWK) of 2 us, the timing is:

tMW=tPWD+(tPWK),
tHW=tHWD+tMW,

The sequential host write speed (SHWS)=(No. of bytes)/tHW has a speed increase.

The phase-change memory system increases the throughput of one or more phase-change memory devices by performing one or more of a read-ahead memory operation, a write-ahead memory write operation, a larger page memory write operation, a wider data bus memory write operation, a dual-channel concurrent memory read operation, a dual-channel concurrent memory write operation, a write-cache memory write operation, and any combination thereof.

ALTERNATE EMBODIMENTS

Several other embodiments are contemplated by the inventors. For example different numbers and arrangements of devices and banks may be used, such as 32 banks, 64 banks, or 8 banks. The number of banks may be roughly matched to the ratio of set to reset times. For example, a 100 ns set time and 10 ns reset time has a ratio of 10, and can use 10 or more banks interleaved, such as 16 banks. Should the set time be reduced to 50 ns, the ratio drops to 5, and 5 or more banks, such as 8 banks, may be optimal. Data lines 50 may allow only 1 byte to be transferred at a time, and the bank write latches 32 could be loaded sequentially. Alternately, data lines 50 may be wider, allowing 2 banks to be loaded at once. An 8-byte-wide data lines 50 could allow all bank write latches 32 for 8 banks to be written at once. Other combinations of data widths are contemplated.

The PCM controller and PCM memory device may support various operations such as Read (Random Byte read, Block read, page read, Buffered Page read), Program (Random Byte write, block write, page write, and buffered page write), Erase (Block erase, Page erase), Read Status, Read ID, Read PCM Type, Copy Back, and Reset command. ECC support may be provided.

Configurable features may include block size, page size, data bus width, PCM memory chip size, number of banks, interrupt enable, ECC functionality, copy back functionality, command configuration, number of address cycles (3 address-byte cycles can address up to 8 Gbit memory, for higher capacity, like 16-Gb or above, 4 address cycles may be needed), number of ID read and status read cycles, spare area usage definition, etc.

Addresses may be latched at the local banks in the local X-decoder and local Y-decoder. The X-decoder latches the X portion of the address, either before or after decoding, while the Y-decoder latches the Y portion of the address, either before or after decoding. A bank enable may also be latched. Alternately, addresses may be latched outside of the PCM bank array. Sequential addresses could be internally generated or altered. Various burst orders of the data bytes and addresses may be used.

While an 8-bit data byte has been described, the data word could be other widths, such as 4 bits, 12 bits, 16 bits, or multiples of 8 bits, or other values. Array data mux 38 could be a mux with logic gates or transmission gates, or could use wired-OR logic or be a bus multiplexer that uses the data lines that are physically connected to several or all banks, and are controlled to connect each data byte to just one bank at a time. Time multiplexing may also be employed.

While a PCM chip with various internal functions has been described, some functions could be performed outside of the PCM chips, such as by a PCM controller, microcontroller, glue logic, bus controller, or other chips. Address translation or pre-decoding could also be performed. The PCM array could be on several chips rather than on one chip, or could be integrated with a larger system chip having other functions such as a processor.

The PCM cells can use select transistors in series with the variable resistor as shown, or additional transistors may be added, such as for a dual-port memory with 2 bit lines per cell, and two select transistors that connect to the same alloy resistor. The melting and crystalline temperatures may vary with the alloy composition and with other factors such as impurities. The shape and size of the alloy resistor may also affect these temperatures and set, reset time periods.

The terms set and reset can be applied to either binary logic state. For example, set can refer to changing to the logic 1 state for positive logic, or to changing to the logic 0 state for negative or inverse logic. Likewise, reset is to 0 for positive logic, but inverted logic can reset to 1, such as for active-low logic. Set and reset can also refer to remaining in the previous state, such as setting a cell that is already 1. One system can use both active-high and active-low logic domains, and logic can refer to the physical states of the memory cells, or the data read at the I/O of a memory chip, or at some other point.

Directional terms such as upper, lower, up, down, top, bottom, etc. are relative and changeable as devices are rotated, flipped over, etc. These terms are useful for describing the device but are not intended to be absolutes. Some embodiments may have chips or other components mounted on only one side of a circuit board, while other embodiments may have components mounted on both sides.

The waveforms shown are idealized. Actual waveforms, such as those measured on lab equipment such as an oscilloscope, may have different shapes, slopes, and noise. Pulses may be offset in time relative to each other to further reduce peak currents, and other techniques may be used to reduce peak currents.

The address decoders may be included as part of a memory controller, microcontroller, serial engine, DMA, PCM memory controller, transaction manager, or other controllers. Functions can be implemented in a variety of ways. Some functions can be programmed and executed by a CPU or other processor, or can be implemented in dedicated hardware, firmware, or in some combination. Many partitioning of the functions can be substituted.

Other serial buses may be used for the host such as PCI Express, ExpressCard, Firewire (IEEE 1394), serial ATA, serial attached small-computer system interface (SCSI), etc. When PCI Express is used, additional pins for the PCI Express interface can be added or substituted for USB differential data pins. PCI express pins include a transmit differential pair PET+, PET−, and a receive differential pair PER+, PER− of data pins. A multi-bus-protocol chip could have an additional personality pin to select which serial-bus interface to use, or could have programmable registers. ExpressCard has both a USB and the PCI Express bus, so either or both buses could be present on an ExpressCard device.

The controller components such as the serial engine, DMA, PCM memory controller, transaction manager, and other controllers and functions can be implemented in a variety of ways. Functions can be programmed and executed by the CPU or other processor, or can be implemented in dedicated hardware, firmware, or in some combination. Many partitioning of the functions can be substituted.

A standard flash, DRAM, or SRAM controller may be integrated with the PCM controller to allow for accessing these various kinds of memories. Various routines may contain instructions that are part of the operating system, basic input-output system (BIOS), manufacturer-specific routines, and higher-level application programs, and various combinations thereof. Various modified bus architectures may be used. Buses such as the local bus may have several segments isolated by buffers or other chips.

The phase-change memory has been described as having cells that each store one binary bit of data. However, multi-level cells are contemplated wherein multiple logic levels are defined for different values of resistance of the alloy resistor.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another a tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A phase-change-memory peripheral comprising:

a peripheral phase-change-memory controller having a central processing unit (CPU) for executing instructions and a random-access memory (RAM) for storing instructions for execution by the CPU;

throughput-increasing control routines of instructions executed by the CPU, wherein the throughput-increasing control routines increase a throughput of the phase-change-memory peripheral by performing one or more of a read-ahead memory operation, a write-ahead memory write operation, a larger page memory write operation, a wider data bus memory write operation, a dual-channel concurrent memory read operation, a dual-channel concurrent memory write operation, a write-cache memory write operation, a multi-channel concurrent multi-bank memory read operation, a multi-channel concurrent multi-bank memory write operation, a multi-channel concurrent multi-bank memory write cache operation;

a bus transceiver in the peripheral phase-change-memory controller for receiving peripheral commands and data from a host over a host bus;

a phase-change-memory controller in the peripheral phase-change-memory controller;

a plurality of phase-change memory (PCM) cells organized as phase-change-memory mass storage devices, coupled to the phase-change-memory controller, for storing non-volatile data for the host, the data in the phase-change-memory mass storage devices being block-addressable and not randomly-addressable;

wherein each PCM cell in the plurality of PCM cells has a first logical state having an alloy in a crystalline phase and a second logical state having the alloy in an amorphous phase, wherein a resistance of the alloy is higher when in the amorphous phase than when in the crystalline phase; and a phase-change-memory bus having data lines for transferring data from the phase-change-memory controller to the phase-change-memory mass storage devices, whereby the peripheral phase-change-memory controller controls the phase-change-memory mass storage devices that are block-addressable.

2. The phase-change-memory peripheral of claim 1 wherein a PCM cell in the plurality of PCM cells comprises:

a select transistor receiving a word line on a gate, and having a channel between a bit line and a cell node;

an alloy resistor formed from the alloy, coupled between the cell node and an array voltage;

wherein the PCM cell has the first logical state when the alloy resistor has the alloy in the crystalline phase, the alloy resistor having a low resistance that increases a sensing current from the bit line through the select transistor;

wherein the PCM cell has the second logical state when the alloy resistor has the alloy in the amorphous phase, the alloy resistor having a high resistance that reduces the sensing current from the bit line through the select transistor;

wherein the high resistance is larger than the low resistance;

whereby the sensing current is altered by the alloy being in the crystalline phase and the amorphous phase.

3. The phase-change-memory peripheral of claim 2 further comprising write drivers which comprise:

a set current generator, coupled to the bit line, for driving a set current through the select transistor and through the alloy resistor for a set period of time to write the PCM cell into the first logical state in response to set data bits in the data;

a reset current generator, coupled to the bit line, for driving a reset current through the select transistor and through the alloy resistor for a reset period of time to write the PCM cell into the second logical state in response to reset data bits in the data;

a reset timer for determining the reset period of time; and a set timer for determining the set period of time;

wherein the set period of time is at least double the reset period of time, whereby the PCM cell is set for a longer time period, and reset for a shorter time period.

4. The phase-change-memory peripheral of claim 3 wherein the reset current is at least twice the set current, and wherein the set current is at least twice the sensing current;

whereby the PCM cell is set by a lower current for a longer time period, and reset by a higher current and a shorter time period.

5. The phase-change-memory peripheral of claim 4 wherein the alloy is a chalcogenide glass layer having a melting point that is higher than a crystallization point.

6. The phase-change-memory peripheral of claim 5 wherein the alloy is an alloy of germanium (Ge), antimony (Sb), and tellurium (Te).

7. The phase-change-memory peripheral of claim 1 wherein the PCM cells are organized into banks that are concurrently writable, further comprising:

local bank write latches, storing write data that includes set data bits indicating the first logical state and reset data bits indicating the second logical state, the local bank write latches coupled to control local write drivers to drive the set pulse and the reset pulse to the selected PCM cells.

8. The phase-change-memory peripheral of claim 2 wherein the bus transceiver connects to the host bus which is a Multi-Media Card/Secure Digital (MMC/SD) bus, an integrated device electronics (IDE) bus, an AT-Attachment (ATA) bus, a CompactFlash (CF) bus, a Memory Stick (MS) interface bus, a Serial AT-Attachment (SATA) bus, a Small Computer System Interface (SCSI) bus, or a PCI-Express (PCIe) interface bus.

9. A phase-change-memory solid-state-storage device comprising:

host interface means for connecting to a host over a host bus;

a phase-change-memory controller having a processor for executing instructions;

a main memory coupled to the processor for storing instructions for execution by the processor;

phase-change memory means for storing a data word as binary bits each represented by a chalcogenide glass layer having a melting point that is higher than a crystallization point, the chalcogenide glass layer forming a variable resistor that alters a sensing current when a binary bit is read;

wherein a crystalline state of the variable resistor represents a first binary logic state and an amorphous state of the variable resistor represents a second binary logic state for binary bits stored in the phase-change memory means;

phase-change-memory controller means for controlling access of the phase-change memory means; and throughput-increasing control routine means for execution by the processor, wherein the throughput-increasing control routine means is for increasing a throughput of the phase-change-memory controller.

10. The phase-change-memory solid-state-storage device of claim 9 wherein the throughput-increasing control routine means comprises at least one of:

read-ahead memory operation means for performing a read-ahead memory operation on the phase-change memory means;

write-ahead memory write operation means for performing a write-ahead memory operation on the phase-change memory means;

dual-channel concurrent read memory operation means for performing a dual-channel concurrent read memory operation on the phase-change memory means;

dual-channel concurrent write memory operation means for performing a dual-channel concurrent write memory operation on the phase-change memory means;

write-cache memory operation means for performing a write-cache memory operation on the phase-change memory means;

multi-channel concurrent multi-bank interleaved read-ahead memory operation means for performing a read-ahead memory operation on multiple interleaved banks of the phase-change memory means using multiple channels; and multi-channel concurrent multi-bank interleaved write-ahead memory operation means for performing a write-ahead memory operation on multiple interleaved banks of the phase-change memory means using multiple channels.

11. The phase-change-memory solid-state-storage device of claim 10 further comprising:

address translation means for translating block addresses from the processor to access the phase-change memory means as data blocks having multiple data words; and direct-memory access (DMA) engine means for directly transferring data and instructions over an internal bus among the host interface, the main memory, the processor, and the phase-change-memory controller means, whereby data blocks are accessed in the phase-change memory means.

12. The phase-change-memory solid-state-storage device of claim 11 wherein the host interface comprises:

host transceiver means for receiving clocked data and commands from the host bus, and for driving data onto the host bus in response to a command;

host operating register means for storing data and commands in a format specified by a host protocol specification; and command decoder and validator means, coupled to the host operating register means, for decoding and validating a command received over the host bus by the host transceiver means.

13. The phase-change-memory solid-state-storage device of claim 12 wherein the host bus is a Multi-Media Card/Secure Digital (MMC/SD) bus, an integrated device electronics (IDE) bus, an AT-Attachment (ATA) bus, a CompactFlash (CF) bus, a Memory Stick (MS) interface bus, a Serial AT-Attachment (SATA) bus, a Small Computer System Interface (SCSI) bus, or a PCI-Express (PCIe) interface bus.

14. The phase-change-memory solid-state-storage device of claim 10 wherein the phase-change-memory controller means further comprises:

a first channel for connecting to a first section of the phase-change memory means, the first channel comprising:

first PCM interface control registers for storing control information for controlling operation of the first section of the phase-change memory means;

first sector buffers for storing a first block of data for writing to the first section of the phase-change memory means;

first PCM DMA engine means for transferring the first block of data from the first sector buffers to the first section of the phase-change memory means;

a second channel for connecting to a second section of the phase-change memory means, the second channel comprising:

second PCM interface control registers for storing control information for controlling operation of the second section of the phase-change memory means;

second sector buffers for storing a second block of data for writing to the second section of the phase-change memory means; and second PCM DMA engine means for transferring the second block of data from the second sector buffers to the second section of the phase-change memory means, whereby the phase-change-memory controller means has multiple channels to access the phase-change memory means.

15. A phase-change-memory peripheral system comprising:

a clocked-data interface to a host bus that connects to a host;

a bus transceiver for detecting and processing commands sent over the host bus;

a buffer for storing data sent over the host bus;

an internal bus coupled to the buffer;

a random-access memory (RAM) for storing instructions for execution, the RAM on the internal bus;

a central processing unit, on the internal bus, the CPU accessing and executing instructions in the RAM;

a phase-change-memory controller, on the internal bus, for generating phase-change-memory-control signals and for buffering data to a phase-change-memory bus;

phase-change-memory devices coupled to the phase-change-memory controller by the phase-change-memory bus, and controlled by the phase-change-memory-control signals;

a direct-memory access (DMA) engine, on the internal bus, for transferring data over the internal bus;

wherein the phase-change-memory devices comprise an array of memory cells;

an alloy resistor in each memory cell in the array of memory cells, the alloy resistor storing binary data as solid phases each having a different resistivity;

wherein the alloy resistor changes from a crystalline state to an amorphous state when a memory cell is written from a logic 1 state to a logic 0 state in response to a reset current for a reset period of time;

wherein the alloy resistor changes from the amorphous state to the crystalline state when the memory cell is written from a logic 0 state to a logic 1 state in response to a set current for a set period of time;

wherein the amorphous state has a higher resistance than the crystalline state that is sensed by a sense amplifier; and a plurality of write drivers that apply the set current for the set period of time to memory cells being written by bits in the logic 1 state, and apply the reset current for the reset period of time to memory cells being written by bits in the logic 0 state, whereby data from the host is stored by the crystalline state and the amorphous state of the alloy resistor in each memory cell.

16. The phase-change-memory peripheral system of claim 15 further comprising:

throughput-increasing control routines of instructions for execution by the CPU, wherein the throughput-increasing control routines increase a throughput of the phase-change-memory controller.

17. The phase-change-memory peripheral system of claim 16 wherein the phase-change-memory devices further comprise:

a plurality of banks of memory cells, each bank in the plurality of banks having an array of memory cells;

a data input for receiving a data word to store in the phase-change memory;

a write buffer, coupled to the data input to receive the data word;

data lines coupled between the write buffer and the plurality of banks of memory cells, for transferring the data word to the plurality of banks;

a plurality of bank write latches, wherein each bank in the plurality of banks has a local bank write latch that receives a bank portion of the data word from the data lines;

wherein the plurality of write drivers comprise, for each bank in the plurality of banks, a local write driver that applies the set current for the set period of time to memory cells being written by bits in the logic 1 state in the bank portion of the data word stored in the local bank write latches, and that applies the reset current for the reset period of time to memory cells being written by bits in the logic 0 state in the bank portion of the data word stored in the local bank write latches;

wherein the set period of time is at least 5 times longer than the reset period of time;

wherein unequal set and reset pulses are applied to the alloy resistors to for changes between the crystalline state and the amorphous state; and a plurality of bank sense amplifiers, wherein each bank in the plurality of banks has a local bank sense amplifier that senses data stored in selected memory cells by sensing currents passing through alloy resistors having a higher resistance when in the amorphous state than when in the crystalline state;

wherein the bank portion of the data word is written from the local bank write latches into the memory cells while the data lines are disconnected from writing the local bank write latches, the data lines able to transfer data to other banks in the plurality of banks while the data word is written from the local bank write latches into the memory cells, whereby concurrent writes and data transfers to different banks are performed.

18. The phase-change-memory peripheral system of claim 17 wherein the set period of time is about 100 nanoseconds.

19. The phase-change-memory peripheral system of claim 17 wherein the data word stored in the memory cells is retained when power is disconnected, wherein the alloy resistors remain in the amorphous state and remain in the crystalline state when power is disconnected;

whereby the data word is stored in non-volatile memory.

20. The phase-change-memory peripheral system of claim 17 wherein the throughput-increasing control routines comprise at least one of:

read-ahead memory operation means for performing a read-ahead memory operation on the phase-change memory devices;

write-ahead memory write operation means for performing a write-ahead memory operation on the phase-change memory devices;

dual-channel concurrent read memory operation means for performing a dual-channel concurrent read memory operation on the phase-change memory devices;
dual-channel concurrent write memory operation means for performing a dual-channel concurrent write memory operation on the phase-change memory devices; and
write-cache memory operation means for performing a write-cache memory operation on the phase-change memory devices.

* * * * *